US010890701B2

(12) United States Patent
Yoshizawa et al.

(10) Patent No.: US 10,890,701 B2
(45) Date of Patent: Jan. 12, 2021

(54) LAMINATE, METHOD OF PRODUCING THE SAME, POLARIZING PLATE, LIQUID CRYSTAL DISPLAY DEVICE, AND ORGANIC EL DISPLAY DEVICE

(71) Applicant: FUJIFILM Corporation, Tokyo (JP)

(72) Inventors: Masataka Yoshizawa, Kanagawa (JP); Akira Yamamoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 179 days.

(21) Appl. No.: 15/356,973

(22) Filed: Nov. 21, 2016

(65) Prior Publication Data

US 2017/0068031 A1    Mar. 9, 2017

Related U.S. Application Data

(63) Continuation of application No. PCT/JP2015/065403, filed on May 28, 2015.

(30) Foreign Application Priority Data

May 30, 2014 (JP) ................. 2014-113443

(51) Int. Cl.
| | |
|---|---|
| G02B 5/30 | (2006.01) |
| G02F 1/13363 | (2006.01) |
| H01L 51/50 | (2006.01) |
| G02F 1/1337 | (2006.01) |
| H01L 51/52 | (2006.01) |
| H01L 51/56 | (2006.01) |
| G02F 1/1335 | (2006.01) |

(52) U.S. Cl.
CPC ....... *G02B 5/3016* (2013.01); *G02F 1/13363* (2013.01); *G02F 1/133788* (2013.01); *H01L 51/50* (2013.01); *H01L 51/5293* (2013.01); *H01L 51/56* (2013.01); *C09K 2323/02* (2020.08); *C09K 2323/031* (2020.08); *C09K 2323/05* (2020.08); *G02F 1/133528* (2013.01)

(58) Field of Classification Search
CPC ............. G02F 1/1335; G02F 1/133528; G02F 1/13363; G02B 5/30; G02B 5/3016; Y10T 428/1005–1032; Y10T 428/1041
See application file for complete search history.

(56) References Cited

U.S. PATENT DOCUMENTS

| | | | |
|---|---|---|---|
| 2006/0165918 A1 | 7/2006 | Ito | |
| 2006/0210709 A1 | 9/2006 | Shutou | |
| 2007/0102668 A1* | 5/2007 | Oh | C08F 220/36 252/299.01 |
| 2008/0036946 A1* | 2/2008 | Ono | C08F 220/30 349/96 |
| 2009/0135462 A1* | 5/2009 | Kumar | C09B 57/00 359/243 |
| 2012/0013834 A1 | 1/2012 | Ryu et al. | |
| 2012/0021142 A1* | 1/2012 | Lee | G02F 1/133636 428/1.2 |
| 2015/0293287 A1 | 10/2015 | Yasui et al. | |

FOREIGN PATENT DOCUMENTS

| | | |
|---|---|---|
| JP | 2004-053770 A | 2/2004 |
| JP | 2005-091481 A | 4/2005 |
| JP | 2012108465 A | 6/2012 |
| JP | 2013-538363 A | 10/2013 |
| JP | 2014-48497 A | 3/2014 |
| JP | 2014-051593 A | 3/2014 |
| JP | 2014048497 A | 3/2014 |
| JP | 2014-063143 A | 4/2014 |
| JP | 2014-066964 A | 4/2014 |
| JP | 2014063143 A * | 4/2014 |
| KR | 10-2013-0048760 A | 5/2013 |
| KR | 10-2014-0030060 A | 3/2014 |
| KR | 10-2014-0032890 A | 3/2014 |

OTHER PUBLICATIONS

Notification of Reasons for Refusal, issued by the Japanese Patent Office dated Oct. 3, 2017, in connection with Japanese Patent Application No. 2014-113443.
International Preliminary Report on Patentability issued by WIPO dated Dec. 15, 2016, in connection with International Patent Application No. PCT/JP2015/065403.
Office Action, issued by the Korean Intellectual Property Office dated Nov. 9, 2017, in connection with corresponding Korean Patent Application No. 10-2016-7033213.
International Search Report issued in PCT/JP2015/065403 dated Jul. 7, 2015.
Office Action, issued by the Korean Intellectual Property Office dated Oct. 26, 2018, in connection with corresponding Korean Patent Application No. 10-2016-7033213.
Office Action, issued by the State Intellectual Property Office dated Apr. 26, 2018, in connection with Corresponding Chinese Patent Application No. 201580028421.8.
Office Action, issued by the Korean Intellectual Property Office dated Jun. 28, 2018, in connection with corresponding Korean Patent Application No. 10-2016-7033213.

(Continued)

*Primary Examiner* — Sophie Hon
(74) *Attorney, Agent, or Firm* — Edwards Neils LLC; Jean C. Edwards, Esq.

(57) ABSTRACT

The present invention is to provide a laminate that includes a polarizer and a photo alignment film and is excellent in the moisture-heat resistance of the polarizer, a method of producing a laminate, a polarizing plate, a liquid crystal display device, and an organic EL display device including the laminate. The laminate of the present invention includes a polarizer, and a photo alignment film that is adjacently arranged on the polarizer, the photo alignment film is a layer formed by bringing a composition for forming a photo alignment film into direct contact with a surface of the polarizer, and the composition for forming a photo alignment film contains Compound A having a photo-aligned group and Compound B having a crosslinking group, or Compound C having a photo-aligned group and a crosslinking group.

12 Claims, No Drawings

(56) References Cited

OTHER PUBLICATIONS

Office Action, issued by the Japanese Patent Office dated Jul. 3, 2018, in connection with corresponding Japanese Patent Application No. 2014-113443.
Office Action issued by the State Intellectual Property Office dated Mar. 22, 2019, in connection with Chinese Patent Application No. 201580028421.8.
Decision of Refusal issued by the Japanese Patent Office dated Oct. 8, 2019, in connection with Japanese Patent Application No. 2014-113443.
Decision of Dismissal of Amendment issued by the Japanese Patent Office dated Oct. 8, 2019, in connection with Japanese Patent Application No. 2014-113443.
Japanese Office Action issued by the Japan Patent Office dated Apr. 2, 2019 in connection with Japanese Patent Application No. 2014-113443.
Office Action, issued by the Japanese Patent Office dated Sep. 15, 2020, in connection with Japanese Patent Application No. 2019-219348.

* cited by examiner

LAMINATE, METHOD OF PRODUCING THE SAME, POLARIZING PLATE, LIQUID CRYSTAL DISPLAY DEVICE, AND ORGANIC EL DISPLAY DEVICE

CROSS-REFERENCE TO RELATED APPLICATIONS

This application is a Continuation of PCT International Application No. PCT/JP2015/065403 filed on May 28, 2015, which was published under PCT Article 21(2) in Japanese, and which claims priority under 35 U.S.C. § 119(a) to Japanese Patent Application No. 2014-113443 filed on May 30, 2014. The above applications are hereby expressly incorporated by reference, in their entirety, into the present application.

BACKGROUND OF THE INVENTION

1. Field of the Invention

The present invention relates to a laminate, a method of producing the same, a polarizing plate, a liquid crystal display device, and an organic EL display device.

2. Description of the Related Art

In various display devices such as a liquid crystal display device and an organic EL display device, a polarizing plate is used. For example, as a polarizing plate included in a liquid crystal display device, in order to realize higher quality image display through optical compensation using phase difference, a polarizing plate including a polarizer and an optically anisotropic layer is used.

As the polarizing plate, for example, JP2004-53770A discloses a polarizing plate having an optically anisotropic layer formed from a polarizing film (polarizer) and liquid crystal molecules, in which the optically anisotropic layer is provided on the surface of the polarizer via an alignment film. That is, a polarizing plate having a polarizer, an alignment film, and an optically anisotropic layer in this order is disclosed.

SUMMARY OF THE INVENTION

On the other hand, in recent years, reduction in thickness of display devices (for example, an in-place-switching (IPS) mode liquid crystal display device) has been advanced, and according to the reduction in thickness, there has been a demand for reduction in thickness of members (for example, a polarizing plate) to be used. In consideration of such a circumstance, the use of a thinner polarizer can be expected to lead to further reduction in thickness of display devices.

When the present inventors made an attempt to produce an alignment film by arranging a layer of a composition for forming an alignment film directly on a thin polarizer and subjecting the layer to a rubbing treatment with reference to JP2004-53770A, it was found that when a treatment of pressing and rubbing the layer with rubbing rollers was carried out due to a decrease in the mechanical strength of the polarizer resulting from a reduction in thickness, there arose problems in that the polarizer was torn, the alignment film was peeled off, or the like.

Here, when the present inventors conducted studies of using a so-called photo alignment film that exhibits alignment capability by light irradiation as an alignment film, in the laminate including the obtained polarizer and photo alignment film, the moisture-heat resistance of the polarizer was not always sufficient and further improvement was required.

The present invention has been made in consideration of the above circumstances, and an object thereof is to provide a laminate that includes a polarizer and a photo alignment film and is excellent in the moisture-heat resistance of the polarizer.

The present invention is to provide a method of producing the laminate, a polarizing plate, a liquid crystal display device, and an organic EL display device including the laminate.

As a result of intensive investigations of problems of the related art, the present inventors have found that the above problems can be solved by using a composition for forming a photo alignment film including a predetermined component.

That is, it had been found that the above object can be achieved by adopting the following configurations.

(1) A laminate comprising: a polarizer; and a photo alignment film that is adjacently arranged on the polarizer,
in which the photo alignment film is a layer formed by bringing a composition for forming a photo alignment film into direct contact with a surface of the polarizer, and
the composition for forming a photo alignment film contains Compound A having a photo-aligned group and Compound B having a crosslinking group, or Compound C having a photo-aligned group and a crosslinking group.

(2) The laminate according to (1), in which the photo-aligned group is a group having a structure in which photodimerization or photoisomerization is caused.

(3) The laminate according to (1) or (2), in which the photo-aligned group is a group selected from the group consisting of a group having an azobenzene structure and a group having a cinnamoyl structure.

(4) The laminate according to any one of (1) to (3), in which the crosslinking group is a photocrosslinking group.

(5) The laminate according to (4), in which the photocrosslinking group includes at least one selected from the group consisting of a (meth)acryloyl group, a vinyl group, a styryl group, an allyl group, an epoxy group, an oxetanyl group, and a vinyloxy group.

(6) The laminate according to any one of (1) to (3), in which the crosslinking group is a thermal crosslinking group.

(7) The laminate according to (6), in which the thermal crosslinking group includes at least one selected from the group consisting of a hydroxy group, a carboxyl group, an amino group, a thiol group, a methylol group, an alkoxysilane group, an isocyanate group, an acid anhydride group, an epoxy group, an oxetane group, and a boronic acid group.

(8) The laminate according to (6) or (7), in which the thermal crosslinking group includes at least one selected from the group consisting of a hydroxy group, a carboxyl group, an amino group, and a thiol group, and at least one selected from the group consisting of a methylol group, an alkoxysilane group, an isocyanate group, an acid anhydride group, an epoxy group, an oxetane group, and a boronic acid group.

(9) The laminate according to any one of (1) to (8), further comprising: an optically anisotropic layer including a liquid crystal compound on a surface of the photo alignment film on the side opposite to the polarizer.

(10) A method of producing the laminate according to any one of (1) to (9) comprising at least:
a step of forming a coating film on the polarizer by bringing the composition for forming a photo alignment film containing Compound A having a photo-aligned group and Compound B having a crosslinking group, or Compound C having a photo-aligned group and a crosslinking group into direct contact with a surface of the polarizer; and a step of forming a photo alignment film by subjecting the coating film to a curing treatment and a photo alignment treatment in random order.

(11) A polarizing plate comprising the laminate according to any one of (1) to (9).

(12) A liquid crystal display device comprising the laminate according to any one of (1) to (9).

(13) The liquid crystal display device according to (12) which is of an IPS mode.

(14) An organic EL display device comprising the laminate according to any one of (1) to (9).

According to the present invention, it is possible to provide a laminate that includes a polarizer and a photo alignment film and is excellent in the moisture-heat resistance of the polarizer.

According to the present invention, it is also possible to provide a method of producing the laminate, a polarizing plate, a liquid crystal display device, and an organic EL display device including the laminate.

DESCRIPTION OF THE PREFERRED EMBODIMENTS

Hereinafter, the present invention will be described in detail. The following description of the constitutional requirements is made on the basis of representative embodiments of the present invention, but it should not be construed that the present invention is limited to those embodiments. The numerical range which is shown by "to" used in the present specification means the range including the numerical values described before and after "to" as the lower limit and the upper limit, respectively. In addition, it is defined that "orthogonal" and "parallel" with respect to angle mean ranges expressed by precise angle ±10°, and "equal" and "different" with respect to angle can be determined based on a criterion that whether the difference is less than 5° or not.

In the present invention, the "tilt angle" means an angle formed between a tilted liquid crystal compound and the plane of layer, and means a largest angle out of angles formed between the direction of maximum refractive index and the plane of layer in a refractive index ellipsoid of the liquid crystal compound. Accordingly, as for a rod-like liquid crystal compound having a positive optical anisotropy, the tilt angle means an angle formed between the longitudinal direction of the rod-like liquid crystal compound, that is, the direction of director, and the plane of layer. In the present invention, the "average tilt angle" means an average value of the tilt angles observed at the upper interface and the lower interface of the optically anisotropic layer. The tilt angle (that is, an inclination with respect to the plane of the optically anisotropic layer in a direction in which the refractive index of the optically anisotropic layer is the maximum) can be measured using an automatic birefringence system (for example, KOBRA 21ADH, manufactured by OJI SCIENCE INSTRUMENTS).

In the present specification, Re(λ) and Rth(λ) represent an in-plane retardation and a retardation in a thickness direction at a wavelength λ, respectively. Re(λ) is measured by making light having a wavelength of λ nm incident to a film in a normal direction using KOBRA 21ADH or WR (manufactured by OJI SCIENCE INSTRUMENTS). Upon selecting the measurement wavelength λ, a wavelength-selecting filter can be manually exchanged or the measurement value can be changed by programming to conduct measurement.

In the case in which the film to be measured is expressed as a monoaxial or biaxial refractive index ellipsoid, Rth(λ) is calculated as follows.

Rth(λ) is calculated with KOBRA 21ADH or WR based on the retardation values obtained by measuring Re(λ) above at a total of 6 points in directions tilted at intervals of 10° from the normal direction of the film up to 50° on one side relative to the normal direction around an in-plane slow axis (determined by KOBRA 21ADH or WR) as a tilt axis (rotation axis) (in the case in which the film does not have a slow axis, an arbitrary in-plane direction of the film may be taken as the rotation axis) by making light having a wavelength of λ nm incident to the film from each of the tilted directions, a hypothetical value of average refractive index, and an inputted film thickness value.

In the above description, in a case of a film that has a direction in which the retardation value thereof is zero at a certain tilt angle relative to the in-plane slow axis thereof in the normal direction taken as a rotation axis, the retardation value at a tilt angle larger than the tilt angle is converted into the corresponding negative value and then calculated by KOBRA 21ADH or WR. Additionally, with the slow axis taken as the tilt axis (rotation axis) (in the case in which the film does not have a slow axis, an arbitrary in-plane direction of the film may be taken as the rotation axis), the retardation values are measured in two arbitrary tilted directions and, based on the above values, the hypothetical value of average refractive index, and the inputted film thickness, Rth can be also calculated according to Equations (1) and (2) below.

$$Re(\theta) = \left[ nx - \frac{(ny \times nz)}{\sqrt{\left(ny\sin\left(\sin^{-1}\left(\frac{\sin(-\theta)}{nx}\right)\right)\right)^2 + \left(nz\cos\left(\sin^{-1}\left(\frac{\sin(-\theta)}{nx}\right)\right)\right)^2}} \right] \times \frac{d}{\cos\left(\sin^{-1}\left(\frac{\sin(-\theta)}{nx}\right)\right)} \quad \text{Equation (1)}$$

$$Rth = \left(\frac{nx + ny}{2} - nz\right) \times d \quad \text{Equation (2)}$$

In the equations, Re(θ) represents the retardation value in the direction tilted by an angle θ from the normal direction. nx represents the refractive index in the in-plane slow axis direction. ny represents the refractive index in the direction orthogonal to the in-plane nx, and nz represents the refractive index in the direction orthogonal to nx and ny. d represents the thickness of the film.

In the case in which the film to be measured cannot be expressed as a monoaxial or biaxial refractive index ellipsoid, that is, the film to be measured has no so-called optical axis, Rth(λ) is calculated as follows.

Rth(λ) is calculated with KOBRA 21ADH or WR based on the retardation values obtained by measuring Re (λ) above at a total of 11 points in directions tilted at intervals of 10° from −50° up to +50° relative to the normal direction of the film around an in-plane slow axis (determined by KOBRA 21ADH or WR) as a tilt axis (rotation axis) by making light having a wavelength of λ nm incident to the film from each of the tilted directions, a hypothetical value of average refraction index and an inputted film thickness value.

In the above measurement, the hypothetical value of average refractive index is available from values listed in catalogues of various optical films in Polymer Handbook (JOHN WILEY & SONS, INC.). Those having the average refractive indices unknown can be measured using an ABBE refract meter. The average refractive indices of some major optical films are listed below: cellulose acylate (1.48), cycloolefin polymer (1.52), polycarbonate (1.59), polymethylmethacrylate (1.49) and polystyrene (1.59). KOBRA 21ADH or WR calculates nx, ny and nz, by inputting the hypothetical values of these average refractive indices and the film thickness. Base on thus-calculated nx, ny and nz, the expression of Nz=(nx−nz)/(nx−ny) is further calculated.

One characteristic of the laminate according to the present invention is that a photo alignment film is formed by bringing a composition for forming a photo alignment film including a predetermined component into direct contact with the polarizer. In the composition for forming a photo alignment film, a compound having a crosslinking group (Compound B or C which will be described later) is included. Although the details of the reason for improving the moisture-heat resistance of the polarizer are not clear, it is assumed that the reason is an influence of the compound having a crosslinking group. More specifically, it is considered that since the compound is bondable to the polarizer via the crosslinking group and the adhesiveness between the photo alignment film and polarizer is improved, in the case in which, for example, a dichromatic component such as iodine or the like is included in the polarizer, the movement of the dichromatic component is suppressed and as a result, the moisture-heat resistance (durability under a wet hot environment) of the polarizer is improved.

The laminate of the present invention has a polarizer, and a photo alignment film that is adjacently arranged on the polarizer.

In the following description, first, a method of producing the laminate will be described in detail and then the configuration of the laminate will be described in detail.

<Method of Producing Laminate>

The method of producing the laminate has at least a step (Step 1) of forming a coating film on the polarizer by bringing a composition for forming a photo alignment film into direct contact with the surface of the polarizer, and a step (Step 2) of forming a photo alignment film from the coating film.

Hereinafter, the materials used and procedures in each step will be described in detail.

[Step 1: Coating Film Forming Step]

Step 1 is a step of forming a coating film on the polarizer by bringing a composition for forming a photo alignment film into direct contact with the surface of the polarizer. By carrying out the step, a coating film corresponding to a precursor film of a photo alignment film (photo alignment material layer) is obtained.

In the following description, first, the members and materials used in the step will be described in detail and then the procedure of the step will be described in detail.

(Polarizer)

The polarizer may be a member having a function of converting light into predetermined linearly polarized light (linear polarizer) and an absorption type polarizer can be mainly used.

As the absorption type polarizer, an iodine-based polarizer, a dye-based polarizer using a dichroic dye, a polyene-based polarizer, and the like can be used. In the iodine-based polarizer and the dye-based polarizer, there are a coating type polarizer and a stretching type polarizer and any type of polarizer can be used. However, a polarizer that is produced by adsorbing iodine or a dichroic dye to polyvinyl alcohol and stretching the polyvinyl alcohol film is preferable.

Among these, from the viewpoint of handleability, a polarizer including a polyvinyl alcohol-based resin (a polymer including —CH$_2$—CHOH— as a repeating unit, particularly, at least one selected from the group consisting of polyvinyl alcohol and ethylene/vinyl alcohol copolymers is preferable) is preferable.

In addition to the absorption type polarizer, reflective type polarizers such as a polarizer obtained by laminating thin films having different birefringent properties, a wire grid type polarizer, a polarizer obtained by combining a cholesteric liquid crystal having a selective reflection range and a ¼ wavelength plate, and the like can also be used.

The thickness of the polarizer is not particularly limited and from the viewpoint of reducing the thickness of an image display device, the thickness is preferably 35 μm or less, more preferably 3 to 25 μm, and still more preferably 5 to 20 μm.

(Composition for Forming Photo Alignment Film)

The composition for forming a photo alignment film is a composition used for forming a photo alignment film and contains Compound A having a photo-aligned group and Compound B having a crosslinking group, or Compound C having a photo-aligned group and a crosslinking group. That is, the composition for forming a photo alignment film contains two types of compounds of Compound A having a photo-aligned group and Compound B having a crosslinking group, or one molecule having two types of functional groups such as Compound C having a photo-aligned group and a crosslinking group. In the case of using Compound C, in addition to above Compound C, Compound A and/or Compound B may be further included in the composition for forming a photo alignment film.

The photo-aligned group included in Compound A and Compound C is a functional group capable of imparting anisotropy to the film by light irradiation. More specifically, the photo-aligned group is a group capable of causing a change in the molecular structure in the group by action of light, for example, irradiation of plane polarized light, typically, a group capable of causing at least one photoreaction selected from a photoisomerization reaction, a photodimerization reaction, and a photodecomposition reaction by action of light, for example, irradiation of plane polarized light.

Among these photo-aligned groups, a group causing a photoisomerization reaction (a group having a structure causing photoisomerization) and a group causing a photodimerization reaction (a group having a structure causing photodimerization) are preferable and a group causing a photodimerization reaction is more preferable.

The photoisomerization reaction refers to a reaction that causes steric isomerization or structural isomerization by action of light. As a material that causes the photoisomerization reaction, such a material is known as a material having an azobenzene structure (K. Ichimura et al., Mol. Cryst. Liq. Cryst., 298, 221 (1997)), a material having a hydrazono-β-ketoester structure (S. Yamamura et al., Liquid Crystals, Vol. 13, No. 2, page 189 (1993)), a material having a stilbene structure (J. G. Victor and J. M. Torkelson, Macromolecules, 20, 2241 (1987)), and a material having a spiropyran structure (K. Ichimura et al., Chemistry Letters, page 1063 (1992); K. Ichimura et al., Thin Solid Films, Vol. 235, page 101 (1993)).

As the group that causes the photoisomerization reaction, a group that includes a C=C bond or N=N bond to cause the photoisomerization reaction is preferable. Specific examples of such a group include a group having an azobenzene structure (skeleton), a group having a hydrazono-β-ketoester structure (skeleton), a group having a stilbene structure (skeleton), and a group having a spiropyran structure (skeleton).

The photodimerization reaction refers to a reaction in which an addition reaction occurs between two groups by action of light, and typically, a ring structure is formed. As a material that causes the photodimerization, such a material is known as a material having a cinnamic acid structure (M. Schadt et al., J. Appl. Phys., Vol. 31, No. 7, page 2155 (1992), a material having a coumarin structure (M. Schadt et al., Nature, Vol. 381, page 212 (1996)), a material having a chalcone structure (Toshihiro Ogawa et al., Preprints of Symposium on Liquid Crystals (Ekisho Toronkai Koen Yokoshu in Japanese), 2AB03 (1997)), and a material having a benzophenone structure (Y. K. Jang et al., SID Int. Symposium Digest, P-53 (1997)).

Examples of the group that causes the photodimerization reaction include a group having a cinnamic acid (cinnamoyl) structure (skeleton), a group having a coumarin structure (skeleton), a group having a chalcone structure (skeleton), a group having a benzophenone structure (skeleton), and a group having an anthracene structure (skeleton). Among these groups, a group having a cinnamic acid structure and a group having a coumarin structure are preferable and a group having a cinnamic acid structure is more preferable.

The number of photo-aligned groups included in Compound A and Compound C is not particularly limited and may be plural. In addition, only one photo-aligned group or plural types of photo-aligned groups may be included in Compound A and Compound C.

The crosslinking group included in Compound B and Compound C is a crosslinkable group and is preferably a group that can be crosslinked (bonded) with the above polarizer. A crosslinking group may react with crosslinking groups.

The type of the crosslinking group is not particularly limited and a photocrosslinking group and a thermal crosslinking group may be mainly used depending on crosslinking reaction (curing reaction).

The photocrosslinking group is a group which conducts crosslinking by light irradiation and examples thereof include a radical polymerizable group and a cationic polymerizable group. A suitable example of the radical polymerizable group includes a (meth)acryloyl group. Specific examples of the cationic polymerizable group include an alicyclic ether group, a cyclic acetal group, a cyclic lactone group, a cyclic thioether group, a spiro ortho ester group, and a vinyloxy group. Among these, an alicyclic ether group and a vinyloxy group are suitable and an epoxy group, an oxetanyl group, and a vinyloxy group are particularly preferable. Among these, as the photocrosslinking group, a (meth)acryloyl group, a vinyl group, a styryl group, an allyl group, an epoxy group, an oxetanyl group, or a vinyloxy group is preferable. The (meth)acryloyl group is a concept including both an acryloyl group and a methacryloyl group.

In the photocrosslinking group, the above photo-aligned group (for example, a group having a cinnamic acid structure) is not included.

The thermal crosslinking group is a group which conducts crosslinking by heating treatment and examples thereof include crosslinking groups described in "Crosslinking agent handbook" (Shinzo Yamamoto, Tosuke Kaneko: published by TAISEISHA Ltd.). Among these, an amide group, a halogen group, a hydroxy group, a carboxyl group, a methylol group, an alkoxysilane group, an isocyanate group, a thiol group, an acid anhydride group, an epoxy group, an oxetane group, a boric acid group, a vinyl group, an aldehyde group, and an oxime group are preferable. A hydroxy group, a carboxyl group, a methylol group, an alkoxysilane group, an isocyanate group, an acid anhydride group, an epoxy group, an oxetane group, and a boric acid group are more preferable and a methylol group and an epoxy group are still more preferable.

As one suitable embodiment of the thermal crosslinking group, the thermal crosslinking group may adopt an embodiment which includes at least one selected from the group consisting of a hydroxy group, a carboxyl group, an amino group, and a thiol group (Thermal crosslinking group A), and at least one selected from the group consisting of a methylol group, an alkoxysilane group, an isocyanate group, an acid anhydride group, an epoxy group, an oxetane group, and a boric acid group (Thermal crosslinking group B). That is, the thermal crosslinking group included in the compound preferably has Thermal crosslinking group A selected from the group and Thermal crosslinking group B selected from the group. According to the embodiment, the moisture-heat resistance of the polarizer is further improved.

The number of crosslinking groups included in Compound B and Compound C is not particularly limited and may be plural. In the case in which Compound B and Compound C are low molecular compounds, which will be described later, when the number of crosslinking group is plural, the number is preferably 2 to 10 and more preferably 4 to 8.

In addition, only one crosslinking group or plural types of crosslinking groups may be included in Compound B and Compound C.

All of Compound A, Compound B, and Compound C may be low molecular compounds or high molecular compounds. A low molecular compound refers to a compound having a molecular weight of 2,000 or less and a high molecular compound refers to a compound having a molecular weight of more than 2,000.

In the case in which Compounds A to C are high molecular compounds, it is preferable that these compounds have a predetermined repeating unit. For example, it is preferable that Compound A and Compound C have a repeating unit having a photo-aligned group (preferably a repeating unit represented by Formula (A1) below), and it is preferable that Compound B and Compound C have a repeating unit having a crosslinking group (preferably a repeating unit represented by Formula (A2) below).

Compound C may have a repeating unit having both a photo-aligned group and a crosslinking group.

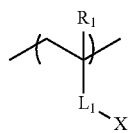

Formula (A1)

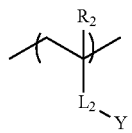

Formula (A2)

In Formula (A1) and Formula (A2), $R_1$ and $R_2$ each independently represent a hydrogen atom and an alkyl group. As the alkyl group, an alkyl group having 1 to 3 carbon atoms is preferably and a methyl group is more preferably.

In Formula (A1) and Formula (A2), $L_1$ and $L_2$ each independently represent a single bond or a divalent linking group. Examples of the divalent linking group include a divalent linking group selected from —O—, —CO—, —NH—, —CO—NH—, —COO—, —O—COO—, an alkylene group, an arylene group, a heterocyclic group (heteroaryl group), and combinations thereof.

In Formula (A1), X represents a photo-aligned group. The definition of the photo-aligned group is as described above.

In Formula (A2), Y represents a crosslinking group. The definition of the crosslinking group is as described above.

Examples of Compound C include compounds represented by Formula (X) described in JP2006-285197A.

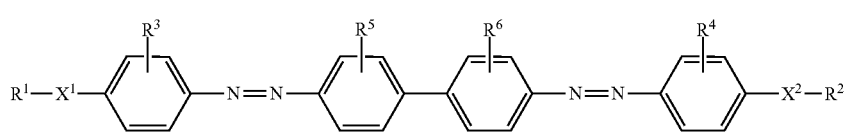

(X)

In the formula, $R^1$ and $R^2$ each independently represent a hydroxy group or a polymer group selected from the group consisting of a (meth)acryloyl group, a (meth)acryloyloxy group, a (meth)acrylamide group, a vinyl group, a vinyloxy group, and a maleimide group.

$X^1$ represents a single bond in the case in which $R^1$ represents a hydroxy group and represents a linking group represented by $-(A^1\text{-}B^1)_m-$ in the case in which $R^1$ represents a polymerizable group, and $X^2$ represents a single bond in the case in which $R^2$ is a hydroxy group and represents a linking group represented by $-(A^2\text{-}B^2)_n-$ in the case in which $R^2$ is a polymerizable group. Herein, $A^1$ is bonded to $R^1$, $A^2$ is bonded to $R^2$, and $B^1$ and $B^2$ are bonded to phenylene groups adjacent to each other. $A^1$ and $A^2$ each independently represent a single bond or a divalent hydrocarbon group and $B^1$ and $B^2$ each independently represent a single bond, —O—, —CO—O—, —O—CO—, —CO—NH—, —NH—CO—, —NH—CO—O—, or —O—CO—NH—. m and n each independently represent an integer of 0 to 4. However, when m or n is 2 or more, plural $A^1$'s, $B^1$'s, $A^2$s and $B^2$s may be the same or different from one another. However, $A^1$ or $A^2$ interposed between two $B^1$'s or $B^2$s is not a single bond. $R^3$ and $R^4$ each independent represent a hydrogen atom, a halogen atom, a carboxyl group, a halogenated methyl group, a halogenated methoxy group, a cyano group, a nitro group, —$OR^7$ (wherein $R^7$ represents a lower alkyl group having 1 to 6 carbon atoms, a cycloalkyl group having 3 to 6 carbon atoms, or a lower alkyl group having 1 to 6 carbon atoms substituted with a lower alkoxy group having 1 to 6 carbon atoms), a hydroxyalkyl group having 1 to 4 carbon atoms, —$CONR^8R^9$ ($R^8$ and $R^9$ each independently represent a hydrogen atom or a lower alkyl group having 1 to 6 carbon atoms), or a methoxycarbonyl group. However, the carboxyl group may form salts with alkali metals.

$R^5$ and $R^6$ each independently represent a carboxyl group, a sulfo group, a nitro group, an amino group, or a hydroxy group. However, the carboxyl group and the sulfo group may form salts with alkali metals.

The composition for forming a photo alignment film may include components other than the above compounds (Compounds A to C).

For example, the composition for forming a photo alignment film may include a solvent. The type of the solvent is not particularly limited and examples thereof include water and organic solvents. Examples of the organic solvents include amino-based solvents (for example, N,N-dimethylformamide), sulfoxide-based solvents (for example, dimethyl sulfoxide), heterocyclic compound-based solvents (for example, pyridine), hydrocarbon-based solvents (for example, benzene, hexane), alkyl halide-based solvents (for example, chloroform, dichloromethane), ester-based solvents (for example, methyl acetate, ethyl acetate, butyl acetate), ketone-based solvents (for example, acetone, methyl ethyl ketone), and ether-based solvents (for example, tetrahydrofuran, 1,2-dimethoxyethane).

In the case in which the composition for forming a photo alignment film include a solvent, the solid content concentration of the solvent included in the composition for forming a photo alignment film is preferably 0.1 to 10% by mass and more preferably 1 to 5% by mass with respect to the total mass of the composition from the viewpoint of handleability (such as coatability).

The solid content means components for forming a photo alignment film (for example, Compounds A to C).

In addition, examples of other components that may be included in the composition for forming a photo alignment film include a polymerization initiator (radical polymerization initiator and cationic polymerization initiator), and a curing agent.

As described below, in the case in which a curing treatment is carried out by a light irradiation treatment, it is preferable to use a photopolymerization initiator having a light absorption wavelength band different from a photo-aligned group-derived absorption band.

(Procedure of Step)

In the step, any method may be used without limitation as long as the composition for forming a photo alignment film can be brought into direct contact with the surface of the polarizer. Any known method can be adopted. For example, a spin coating method, a roll coating method, a flow coating method, a printing method, a dip coating method, a cast film forming method, a hard coat method, a gravure printing method, and the like may be used.

The composition for forming a photo alignment film may be brought into contact with only one surface or both surfaces of the polarizer.

The composition for forming a photo alignment film is brought into contact with the surface of the polarizer and then if necessary, a drying treatment may be carried out in order to remove a volatile component (for example, a solvent). The drying method is not particularly limited and an air drying treatment, a heating treatment, and the like may be used.

The thickness of the coating film obtained through the above procedure is not particularly limited and the thickness may be appropriately adjusted so that the photo alignment film, which will be described later, has a desired thickness. In the range of the above desired thickness, from the viewpoint of the alignment and handleability of the photo alignment film, the thickness is preferably 10 nm to 10 μm and more preferably 20 nm to 1 μm.

[Step 2: Photo Alignment Film Forming Step]

Step 2 is a step of forming a photo alignment film from the coating film obtained in Step 1 above. The photo alignment film refers to an alignment film which exhibits the force for restricting the alignment by light irradiation as described later.

For the procedure of forming such a photo alignment film, a method of carrying out a curing treatment and a photo alignment treatment on the coating film in random order may be used. More specifically, a curing treatment may be carried out on the coating film and then a photo alignment treatment may be carried out on the coating film. Alternatively, a photo alignment treatment may be carried out on the coating film and then a curing treatment may be carried out on the coating film.

Hereinafter, the procedures of the respective treatments will be described in detail.

(Curing Treatment)

The curing treatment means a treatment of conducting reaction of the above crosslinking groups. By carrying out the treatment, a reaction between crosslinking groups in the coating film or a reaction of the polarizer and the crosslinking group in the coating film is conducted. By conducting such a reaction, the moisture-heat resistance of the polarizer is improved.

In the procedure of the curing treatment, a treatment is selected appropriately according to the type of the cross-linking group. It is preferable that in the case in which the crosslinking group is a photocrosslinking group, a light irradiation treatment (photocuring treatment) is carried out and in the case in which the crosslinking group is a thermal crosslinking group, a heating treatment (thermosetting treatment) is carried out.

The type of light source used in the light irradiation treatment is not particularly limited. The light irradiation treatment is preferably carried out with light at a wavelength in an absorption band different from the absorption band of the photo-aligned group and specifically, irradiation with ultraviolet rays of 320 nm or less is preferable and irradiation with light having a wavelength of 250 to 300 nm is more preferable. However, in the case in which the photo alignment film decomposes by ultraviolet rays of 320 nm or less, a polymerization treatment with ultraviolet rays of 320 nm or more is preferably carried out.

In addition, the light used for irradiation is preferably light that is diffused and not polarized in order not to disturb the alignment of the photo-aligned group.

In the case in which light for irradiation is emitted from the same direction as the irradiation direction in the photo alignment treatment, the alignment state of the photo-aligned group is less likely to be disturbed and thus an arbitrary wavelength can be used.

The heating temperature of the heating treatment is not particularly limited. The optimal heating temperature is selected appropriately according to the type of the thermal crosslinking group and typically is preferably within a range of 40 to 300° C. and more preferably within a range of 50 to 150° C.

(Photo Alignment Treatment)

The photo alignment treatment is a treatment for imparting liquid crystal alignment capability by irradiating the photo-aligned group included in the coating film with light and aligning the photo-aligned group in a predetermined direction.

One method for the photo alignment treatment is a method of irradiating the coating film with polarized light. Irradiation with polarized light may be carried out in a direction normal (vertical) to the surface of the coating film or in a direction oblique to the surface of the coating film in order to imparting a pre-tilt angle. In addition, a combination of these may be carried out. The type of polarized light is not particularly limited and either of linearly polarized light and elliptically polarized light may be used. However, in order to effectively carrying out photo alignment, linearly polarized light having a high extinction ratio is preferably used.

Another method for the photo alignment treatment is a method of irradiating the coating film with non-polarized light (light without polarization). In the case of irradiation with non-polarized light, the surface of the coating film is irradiated with the non-polarized light in an oblique direction. At this time, the incident angle of the non-polarized light is preferably within a range of 10 to 80° with respect to the normal line of the surface of the coating film and considering uniformity in irradiation energy on the irradiated surface, the obtained pre-tilt angle, alignment efficiency, and the like, the incident angle is more preferably within a range of 20 to 60° and most preferably 45°.

In order to obtain polarized light in the light irradiation device, there is a need to use a polarizing filter and the like and thus there is a defect that the intensity of light used for irradiation of the surface of the coating film is reduced. However, in the method of irradiation with non-polarized light, there is no need to provide a polarizing filter and the like in the irradiation device and a high irradiation intensity can be obtained. Thus, there is a merit that an irradiation time for photo alignment can be shortened.

In addition, when a photomask is used in the case of irradiation with polarized light, liquid crystal alignment capability can be imparted to the photo alignment film in patterns in two or more different directions. Specifically, it is possible to impart liquid crystal alignment capability to exposed portions in patterns by covering the coating film with a photomask and irradiating the entire surface with polarized light or non-polarized light. If necessary, this operation is repeated plural times and liquid crystal alignment capability can be imparted in plural directions.

The type of light used for irradiation of the photo alignment treatment is not particularly limited and light having the most suitable wavelength can be selected according to the absorption band of the photo-aligned group. For example, ultraviolet rays including light having a wavelength of 150 nm to 800 nm and visible rays can be used and light having a wavelength of 350 nm to 500 nm is preferably used.

Examples of the light source of the light for irradiation include a xenon lamp, a high-pressure mercury lamp, an ultra-high-pressure mercury lamp, a metal halide lamp, and a UV laser such as KrF or ArF.

When the light from such a light source is led to pass through a polarization filter, the Glan-Thompson prism, or a Glan-Taylor prism, it is possible to obtain linearly polarized light. In addition, in the case of using either of polarized light and non-polarized light, it is particularly preferable that the light for irradiation is almost parallel light.

The amount of irradiation in the photo alignment treatment is not particularly limited and from the viewpoint of effectively imparting liquid crystal alignment capability and reducing the production cost, the amount of irradiation is preferably 0.1 to 3,000 $mJ/cm^2$ and more preferably 1 to 1,000 $mJ/cm^2$.

<Laminate>

Through the above steps, a laminate having the polarizer and the photo alignment film that is arranged adjacently on the polarizer can be obtained. The laminate of the present invention is capable of meeting the demand for a reduction in thickness of a display device since the polarizer and the photo alignment film are in direct contact with each other.

The definition of the polarizer included in the laminate is as described above.

The photo alignment film included in the laminate is a film that contains a compound having a group for imparting liquid crystal alignment capability by absorption of light (photo-aligned group) and has liquid crystal alignment capability as described above. In the photo alignment film, the photo-aligned group is aligned in a predetermined direction by the above photo alignment treatment.

The thickness of the photo alignment film is not particularly limited and is appropriately adjusted so that the photo alignment film, which will be described later, has a desired thickness. In the range of the above desired thickness, from the viewpoint of the alignment and handleability of the photo alignment film, the thickness is preferably 10 nm to 10 µm and more preferably 20 nm to 1 µm.

As described above, the crosslinking groups included in Compound B and Compound C react with each other during the curing treatment and most of the groups are deactivated. However, some of these may remain in the photo alignment film.

The laminate may include layers other than the polarizer and the photo alignment film and for example, an optically anisotropic layer may be arranged on the photo alignment film (on the surface opposite to the polarizer).

Hereinafter, the optically anisotropic layer will be described in detail.

(Optically Anisotropic Layer)

The optically anisotropic layer refers to a layer for causing a light phase difference therethrough. The optically anisotropic layer preferably includes a liquid crystal compound. It is preferable that the liquid crystal compound is fixed in a state in which the liquid crystal compound is aligned in a predetermined direction in the optically anisotropic layer.

The type of the liquid crystal compound is not particularly limited and can be classified into a rod-like type (rod-like liquid crystal compound) and a disk-like type (disk-like liquid crystal compound, discotic liquid crystal compound) depending on the shape. Further, each type includes a low molecular type and a high molecular type, respectively. The "high molecular type" generally means a polymer having a degree of polymerization of 100 or more (Kobunshi Butsuri Souten-i Dainamikusu (Polymer Physics and Phase Transition Dynamics), written by Masao Doi, p. 2, Iwanami Shoten, Publishers, 1992). In the present invention, any liquid crystal compound may be used. Two or more rod-like liquid crystal compounds, two or more disk-like liquid crystal compounds, or a mixture of rod-like and disk-like liquid crystal compounds may be used.

As the rod-like liquid crystal compound, for example, liquid crystal compounds described in claim 1 of JP1999-513019A (JP-H11-513019A) and paragraphs "0026" to "0098" of JP2005-289980A may be preferably used. Particularly, from the viewpoint of obtaining excellent panel contrast in the display device including the laminate of the present invention, an optically anisotropic layer exhibiting a smectic phase is preferable. As the disk-like liquid crystal compound, for example, liquid crystal compounds described in paragraphs "0020" to "0067" of JP2007-108732A and paragraphs "0013" to "0108" of JP 2010-244038A may be preferably used. However, there is no limitation thereto.

It is more preferable that the optically anisotropic layer is formed using a liquid crystal compound (rod-like liquid crystal compound or disk-like liquid crystal compound) having a polymerizable group because a temperature change or humidity change of optical properties may be reduced. A mixture of two or more liquid crystal compounds may be used. In such a case, at least one liquid crystal compound preferably has two or more polymerizable groups.

That is, it is preferable that the optically anisotropic layer is a layer that is formed by fixing a rod-like liquid crystal compound or disk-like liquid crystal compound having a polymerizable group through polymerization or the like. In such a case, after the layer is formed, crystallinity does not need to be exhibited any more.

The type of the polymerizable group included in the rod-like liquid crystal compound or disk-like liquid crystal compound is not particularly limited and a functional group capable of causing an addition polymerization reaction is preferable and a polymerizable ethylenically unsaturated group or a ring polymerizable group is preferable. More specifically, a (meth)acryloyl group, a vinyl group, a styryl group, an allyl group, and the like are preferable and a (meth)acryloyl group is more preferable.

The method of forming the optically anisotropic layer is not particularly limited and known methods may be used.

For example, the optically anisotropic layer can be produced by applying a composition for an optically anisotropic layer including a liquid crystal compound having a polymerizable group (hereinafter, also simply referred to as a "composition") to the photo alignment film to form a coating film and subjecting the obtained coating film to a curing treatment (ultraviolet irradiation (light irradiation treatment) or heating treatment).

The application of the composition can be carried out by a known method (for example, a wire-bar coating method, an extrusion coating method, a direct gravure coating method, a reverse gravure coating method and a die coating method).

The composition may include components other than the above liquid crystal compound.

For example, the composition may include a polymerization initiator. The polymerization initiator to be used is selected according to the reaction system and examples thereof include a thermal polymerization initiator and a photopolymerization initiator. For example, examples of the photopolymerization initiator include an α-carbonyl compound, acyloin ether, an r-hydrocarbon substituted aromatic acyloin compound, polynuclear quinone compounds, and a combination of triarylimidazole dimer and p-aminophenylketone.

In addition, the composition may include a polymerizable monomer from the viewpoint of uniformity of the coating film and the strength of the film. Examples of the polymerizable monomer include radical polymerizable compounds and cationic polymerizable compounds. Preferable is a polyfunctional radical polymerizable monomer and a compound copolymerizable with the liquid crystal compound containing a polymerizable group is preferable. Examples thereof include those described in paragraphs "0018" to "0020" of JP2002-296423A.

In addition, the composition may include a surfactant from the viewpoints of uniformity of the coating film and the strength of the film. The surfactant includes conventionally known compounds and a fluorine-based compound is particularly preferable. Specific examples thereof include compounds described in paragraphs "0028" to "0056" of JP2001-330725A, and compounds described in paragraphs "0069" to "0126" of JP2003-295212.

The composition may include a solvent and an organic solvent is preferably used. Examples of the organic solvent include the above organic solvents that may be included in the composition for forming a photo alignment film.

The composition may include various aligning agents such as vertical alignment promoting agents such as a polarizer interface-side vertically aligning agent, and an air interface-side vertically aligning agent, and horizontal alignment promoting agents such as a polarizer interface-side horizontally aligning agent and an air interface-side horizontally aligning agent. These alignment controlling agents are alignment controlling agents capable of horizontally controlling alignment of the rod-like liquid crystal compound in a polarizer interface side or in an air interface side and vertically controlling alignment of the disk-like liquid crystal compound. As these alignment controlling agents, known compounds may be appropriately used. Examples of a polarizer interface-side vertical aligning agent for the disk-like liquid crystal compound include compounds described in paragraphs "0079" to "0104" of JP2012-215704A, and examples of an air interface-side vertical aligning agent for the disk-like liquid crystal compound include compounds described in paragraphs "0106" to "0113" of JP2012-215704A. The contents thereof are incorporated in the present specification by reference.

Further, the composition may include an adhesion improver, a plasticizer, a polymer, and the like other than the above components.

The thickness of the optically anisotropic layer varies depending on the materials to be used and a set phase difference value. The thickness is preferably 0.1 to 15 µm, more preferably 0.2 to 10 µm, and still more preferably 0.3 to 8 µm.

In addition, the preferable range of the in-plane retardation Re(550) of the optically anisotropic layer at a wavelength of 550 nm varies depending on applications.

For example, in the case in which the polarizing plate including the optically anisotropic layer is produced as a $\lambda/4$ plate used in a circularly polarizing plate or the like, in order to make the optically anisotropic layer serve as a phase difference region in which the phase difference is about $\lambda/4$, Re(550) of the optically anisotropic layer is preferably 10 to 200 nm, more preferably 110 to 180 nm, still more preferably 115 to 170 nm, and particularly preferably 120 to 160 nm. In this case, Rth(550) is not particularly limited and in the case of using the optically anisotropic layer as an A plate, the Nz factor which is represented by (Rth/Re)+0.5 is within a range of 0.8 to 1.2 and is most preferably 1.0.

In the case of producing the polarizing plate as a $\lambda/2$ plate, in order to make the optically anisotropic layer serve as a phase difference region in which the phase difference is about $\lambda/2$, Re(550) is preferably 220 to 325 nm, and more preferably 250 to 300 nm. In this case, Rth(550) is not particularly limited and in the case of using the optically anisotropic layer as an A plate, the Nz factor which is represented by (Rth/Re)+0.5 is within a range of 0.8 to 1.2 and is most preferably 1.0.

In addition, in the case of using a laminate formed in a combination of a positive C plate as a $\lambda/2$ plate, the most suitable value varies depending on the physical properties of the C plate to be combined but for example, 100 nm≤Re(550)≤180 nm is preferable, 100 nm≤Re(550)≤150 nm is more preferable, and 120 nm≤Re(550)≤140 nm is still more preferable. Although the preferable range of the retardation Rth(550 nm) of the optically anisotropic layer in the thickness direction at a wavelength of 550 nm varies depending on applications, for example, 30 nm≤Rth(550)≤100 nm is preferable, 40 nm≤Rth(550)≤90 nm is more preferable, and 50 nm≤Rth(550)≤80 nm is still more preferable.

As one suitable embodiment of the optically anisotropic layer, an optically anisotropic layer in which a state in which a polymerizable rod-like liquid crystal compound exhibits a smectic phase is fixed or an optically anisotropic layer in which a state in which a polymerizable rod-like liquid crystal compound, which exhibits a smectic phase and a nematic phase, exhibits a nematic phase is fixed may be mentioned.

In the above optically anisotropic layer, it is preferable that the molecules of the liquid crystal compound are fixed in a state of smectic phase or nematic phase of homogeneous alignment (horizontal alignment) or nearly horizontal tilted alignment in which the liquid crystal compound has a tilt angle of 10° or smaller. The above tilt angle means that an angle between the direction of maximum refractive index and the plane of layer is 10° or less, preferably 3° or less, and particularly preferably 10 or less. The lower limit of the angle the direction of maximum refractive index and the plane of layer is not particularly limited as long as the lower limit of the angle is 0° or more.

The above optically anisotropic layer can be produced by fixing a smectic liquid crystal. In the case of using the smectic liquid crystal, the optically anisotropic layer can be formed in such that first, the smectic liquid crystal is allowed to align (nearly) horizontally and then fixed by polymerization, photocrosslinking, and heat crosslinking.

Since the smectic liquid crystal causes only a small depolarization by scattering of the optically anisotropic layer due to fluctuation in alignment, so that it may be more preferably used for applications where a relatively large retardation of 100 nm or more is required. The smectic phase is not particularly limited and may be selectable from SmA, SmB, SmC, or phases of higher orders.

Whether the liquid crystal compound is fixed in a state of smectic phase or not can be confirmed by observing the X-ray diffraction pattern. When the liquid crystal compound is fixed in a state of smectic phase, an X-ray diffraction pattern derived from orderliness of the layers will be observed, based on which the state of fixation may be determined. In the optically anisotropic layer of the present invention, a smectic liquid crystal may be fixed in a state of nematic phase. Whether the liquid crystal compound is fixed in a state of nematic phase or not can be confirmed by observing the X-ray diffraction pattern. When the liquid crystal compound is fixed in a state of nematic phase, only a broad halo peak is observed in the high angle region, without a sharp peak on the low angle side which is derived from layer formation. The state of fixation may be determined in this manner.

In the present invention, as long as desired properties can be obtained, an optically anisotropic layer in which the alignment state is fixed using a liquid crystal compound which exhibits only a nematic phase may be used.

(Application of Optically Anisotropic Layer)

The optically anisotropic layer of the present invention can be preferably used for various applications. For example, a liquid crystal cell is useful as an optical compensation film for optical compensation or a phase difference plate, such as a wide band $\lambda/4$ plate, a $\lambda/2$ plate, or a $\lambda/4$ plate, for preventing reflection of external light in an organic EL display device.

Further, as the optically anisotropic layer, an A plate having few scattering components and having high contrast or a plate equivalent to the A plate can be obtained. Particularly, since an A plate having reverse wavelength dispersibility or a plate equivalent to the A plate can be obtained, the plate can be preferably used as a wide band λ/4 plate for an organic EL display device or an optical compensation film for a liquid crystal display device.

Particularly, since an A plate with suppressed tilt angle or a plate equivalent to the A plate can be obtained as the optically anisotropic layer, as an optical compensation film for an IPS type or fringe field switching (FFS) type liquid crystal display device having a pre-tilt angle of 0° and formed by using a photo alignment film can be preferably used.

In the present specification, an optically anisotropic layer with low tilt in which the tilt angle is 10° or smaller, particularly, 1° or smaller, (low tilt angle) refers to a monoaxial birefringence layer substantially having an in-plane slow axis.

An example of the embodiment of the optically anisotropic layer includes a positive A plate in which Re(450), Re(550), and Re(650), which are retardation values as measured at wavelengths of 450 nm, 550 nm, and 650 nm respectively, satisfy Equations (1) to (3) below.

$$100 \leq Re(550) \leq 180 \text{ nm} \qquad \text{Equation (1)}$$

$$0.70 \leq Re(450)/Re(550) \leq 0.95 \qquad \text{Equation (2)}$$

$$1.00 \leq Re(650)/Re(550) \leq 1.30 \qquad \text{Equation (3)}$$

It is preferable that the in-plane slow axis of the optically anisotropic layer is orthogonal to the absorption axis of the polarizer.

Further, by adopting an embodiment in which a positive C plate in which Rth(550), which is a retardation value in the thickness direction as measured at a wavelength of 550 nm, satisfies Equation (4) below is laminated on the optically anisotropic layer, for example, in an IPS type optical compensation film or a half-wave plate, a change in tinting and light leakage in a tilted direction can be significantly improved.

$$-180 \leq Rth(550) \leq -10 \qquad \text{Equation (4)}$$

<Polarizing Plate>

The present invention also relates to a polarizing plate including the above laminate.

As the embodiment of the polarizing plate according to the present invention, for example, an embodiment in which an optically anisotropic layer is laminated on the surface of the photo alignment film in the above laminate on the side opposite to the polarizer or an embodiment in which an optically anisotropic layer is laminated on the surface of the photo alignment film in the above laminate on the side opposite to the polarizer and a protective film is laminated on the surface of the polarizer on side opposite to the photo alignment film in the above laminate may be used.

The configuration of the protective film is not particularly limited and for example, a so-called transparent support or hard coat layer may be used or a laminate of a transparent support and a hard coat layer may be used.

As the hard coat layer, a known layer may be used and for example, a layer obtained by curing the above polyfunctional monomer may be used.

In addition, as the transparent support, a known transparent support may be used and for example, as a material for forming a transparent support, materials used for optical materials such as cellulose, cyclic olefin, acryl, polycarbonate, polyester, and polyvinyl alcohol, can be preferably used. A preferable example of the protective film is a cellulose acylate film such as triacetylcellulose film.

<Liquid Crystal Display Device>

The present invention also relates a liquid crystal display device including the laminate.

Generally, a liquid crystal display device has a liquid crystal cell and two polarizing plates arranged on both side of the liquid crystal cell, and the liquid crystal cell supports liquid crystals between two electrode substrates. Further, one optically anisotropic layer is arranged between one side of the liquid crystal cell and the polarizing plate or two optically anisotropic layers are arranged respectively between the liquid crystal cell and the both polarizing plates.

The liquid crystal cell is preferably of a twisted nematic (TN) mode, a vertical alignment (VA) mode, an optically compensated bend (OCB) mode, or an IPS mode or electrically controlled birefringence (ECB) mode and more preferably of an IPS mode. The liquid crystal cell is most preferably of an IPS mode using photo alignment.

In addition, the alignment angle of the rod-like liquid crystal compound used for the liquid crystal cell with respect to the optically anisotropic layer is preferably 1° or smaller.

<Organic EL Display Device>

The present invention also relates to an organic EL (electroluminescence) display device including the laminate of the present invention.

In the organic EL display device, for example, the laminate (the photo alignment film in the laminate is positioned on the optically anisotropic layer side), an optically anisotropic layer, and an organic EL panel may be provided in this order.

The organic EL panel is a member in which a light emitting layer or plural organic compound thin films including a light emitting layer are formed between one pair of electrodes of anode and cathode and may have a hole injecting layer, a hole transporting layer, an electron injecting layer, an electron transporting layer and a protective layer in addition to the light emitting layer. Each of these layers may have different functions. Various materials may be used for forming individual layers.

The anode supplies holes for a hole injecting layer, a hole transporting layer or a light emitting layer, a metal, an alloy, a metal oxide, an electrically conductive compound or a mixture thereof can be used, and materials having a work function of 4 eV or more being preferred. Specific examples thereof include conductive metal oxides such as tin oxide, zinc oxide, indium oxide and indium tin oxide (ITO), metals such as gold, silver, chromium and nickel, mixtures or laminates of the metals and the conductive metal oxides, inorganic conductive substances such as copper iodide and copper sulfide, organic conductive materials such as polyaniline, polythiophene and polypyrrole; and laminates thereof with ITO. Conductive metal oxides are preferable, and ITO is particularly preferred from the view of productivity, high conductivity and transparency. The film thickness of the anode can properly be selected depending on materials constituting the anode, but is typically preferably within the range of 10 nm to 5 μm, more preferably 50 nm to 1 μm, and still more preferably 100 nm to 500 nm.

EXAMPLES

Hereinafter, the present invention will be more specifically described based on examples. The materials, the amount of the materials used, the ratio between the materials, the content and the procedures of treatment, and the like shown in the following examples can be appropriately modified as long as the modification does not depart from the gist of the present invention. Accordingly, the scope of the present invention is not limited to the following specific examples.

Example 1

Preparation of Protective Film

The following composition was put into a mixing tank and stirred to dissolve each component. Thus, a core layer cellulose acylate dope 1 was prepared.

| | |
|---|---|
| Cellulose acetate with an acetyl substitution degree of 2.88 | 100 parts by mass |
| Ester oligomer (Compound 1-1) | 10 parts by mass |
| Durability enhancer (Compound 1-2) | 4 parts by mass |
| Ultraviolet absorbent (Compound 1-3) | 3 parts by mass |
| Methylene chloride (First solvent) | 438 parts by mass |
| Methanol (Second solvent) | 65 parts by mass |

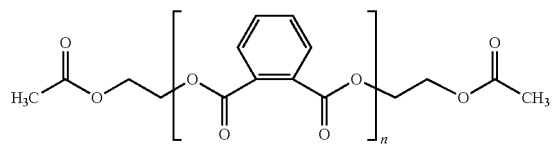

(Compound 1-1)
Molecular weight 1,000

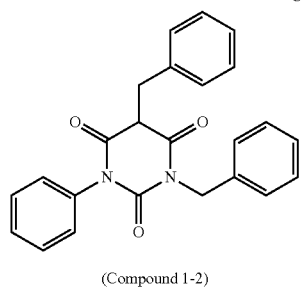

(Compound 1-2)

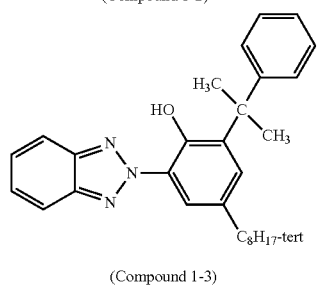

(Compound 1-3)

(Preparation of Outer Layer Cellulose Acylate Dope 1)

To 90 parts by mass of the above core layer cellulose acylate dope 1, 10 parts by mass of a matting agent dispersion 1 having the following composition was added to prepare an outer layer cellulose acylate dope 1.

| | |
|---|---|
| Silica particles with an average particle size of 20 nm (AEROSIL R972, manufactured by NIPPON AEROSIL CO., LTD.) | 2 parts by mass |
| Methylene chloride (First solvent) | 76 parts by mass |
| Methanol (Second solvent) | 11 parts by mass |
| Core layer cellulose acylate dope 1 | 1 part by mass |

(Preparation of Cellulose Acylate Film)

Three layers consisting of core layer cellulose acylate dope 1 and to each side thereof outer layer cellulose acylate dope 1 were simultaneously cast onto a drum at 20° C. from casting ports. In a state of a solvent content of about 20% by mass, the films were peeled off, two edges of the film in a width direction were fixed with tenter clips, and the remaining solvent in a state of 3 to 15% by mass was dried while conducting 1.2-fold stretching in a horizontal direction. Then, by means of conveyance between the rolls of a heat treatment device, a cellulose acylate film having a thickness of 25 μm was prepared as a polarizing plate protective film 01.

(Preparation of Polarizing Plate 01)
1) Saponification of Film

The above-prepared polarizing plate protective film 01 was immersed in a 4.5 mol/L aqueous sodium hydroxide solution (saponification solution) that had been adjusted to 37° C. for 1 minute. Then, the film was rinsed with water, then immersed in a 0.05 mol/L aqueous sulfuric acid solution for 30 seconds, and rinsed with water again. Water was removed using an air knife three times. After removing the water, the film was placed in a drying zone at 70° C. for 15 seconds and dried to prepare a saponified polarizing plate protective film 01.

2) Preparation of Polarizer

According to Example 1 described in JP2001-141926A, a difference in the circumferential speed between two pairs of nip rollers was given. The film was stretched in the longitudinal direction to prepare a polarizer having a width of 1,330 mm and a thickness of 15 μm. The polarizer prepared as described above was used as a polarizer 1.

3) Lamination

The polarizer 1 obtained as described above was laminated with the saponified polarizing plate protective film 01 using a 3% by mass aqueous solution of polyvinyl alcohol (PVA) (PVA-117H, manufactured by Kuraray Co., Ltd.) as an adhesive by roll-to-roll such that the polarization axis (absorption axis) of the polarizer 1 is orthogonal to the longitudinal direction of the saponified polarizing plate protective film 01 to prepare a polarizing plate 01 with a protective film on one side (hereinafter, simply referred to as a polarizing plate 01).

Preparation of Photo Alignment Film A

A composition for forming a photo alignment film A having the following composition was applied to the polarizer in the polarizing plate 01 with a wire bar. Next, the obtained coating film was dried with hot air at 100° C. for 120 seconds and the coating film was irradiated with light in the air using an air cooling metal halide lamp (manufactured by EYEGRAPHICS CO., LTD.) with an output of 300 mW/cm$^2$ (corresponding to a photocuring treatment).

Next, the surface of the coating film which had been subjected to the photocuring treatment was irradiated with ultraviolet rays in the air using an air cooling metal halide lamp (manufactured by EYEGRAPHICS CO., LTD.) with an output of 160 mW/cm$^2$ in the vertical direction to carry out a photo alignment treatment and thus a photo alignment film A was prepared. At this time, a wire grid polarizer (ProFlux PPL02, manufactured by Moxtek, Inc.) was set so as to be parallel with the surface of the coating film and set such that the transparent axis of the wire grid polarizer and absorption axis of the polarizer are parallel with each other, followed by exposure. Ultraviolet rays used herein was radiated at an illuminance of 100 mW/cm$^2$ in a UV-A region (integration of wavelength 380 nm to 320 nm) and an irradiation dose of 1,000 mJ/cm$^2$ in a UV-A region.

| Composition of Composition for Forming Photo Alignment Film A | |
|---|---|
| Material (a) for photo alignment below | 2 parts by mass |
| Adhesion improver 1 below | 1 part by mass |
| Chloroform | 97 parts by mass |

Material for photo alignment:

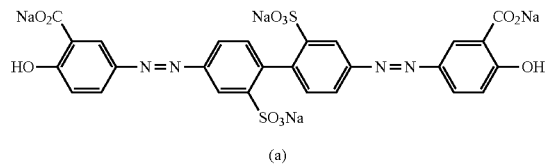

(a)

Adhesion improver 1

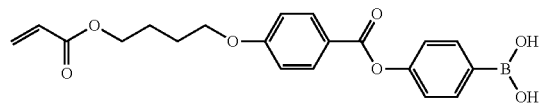

Example 2

Preparation of Photo Alignment Film B

A composition for forming a photo alignment film B having the following composition was applied to the polarizer in the polarizing plate 01 using a spin coater and then baked on a hot plate at a temperature of 100° C. for 60 seconds (thermosetting treatment) to form a coating film having a thickness of 0.2 μm.

The coating film was irradiated with linearly polarized light at 300 to 400 nm in a direction vertical to the surface of the coating film to carry out a photo alignment treatment. Thus, a photo alignment film B was prepared.

| Composition of Composition for Forming Photo Alignment Film B | |
|---|---|
| CIN5 (see below) | 0.99 parts by mass |
| P2 (see below) | 5.96 parts by mass |
| Hexamethoxymethylmelamine | 1.24 parts by mass |
| p-toluenesulfonic acid-hydrate | 0.022 parts by mass |
| Propylene glycol monomethyl ether | 57.01 parts by mass |

CIN5:

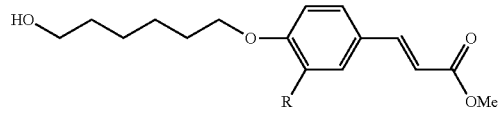

CIN5 R═MeO

P2:

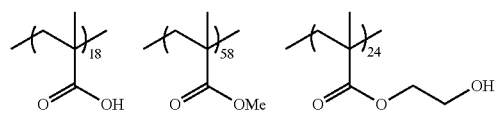

Example 3

Preparation of Photo Alignment Film C

A composition for forming a photo alignment film C having the following composition was applied to the polarizer in the polarizing plate 01 using a method of using a die coater and then was allowed to pass through a drying machine whose temperature was adjusted to 100° C. for 2 minutes to evaporate the solvent and thermally cure the composition. Accordingly, a coating film having a thickness of 200 nm was formed.

The coating film was irradiated with ultraviolet rays polarized through wire grid to carry out a photo alignment treatment and thus a photo alignment film C was obtained. At this time, as an ultraviolet irradiation device, "H valve" (manufactured by Fusion Co., Ltd.) was used. In addition, the wavelength of the polarized ultraviolet rays was set to 313 nm and the cumulative light amount was set to 40 mJ/cm$^2$.

| Composition of Composition for Forming Photo Alignment Film C | |
|---|---|
| Photo alignment material (product mane: ROP-103, manufactured by Rolic Technologies Ltd.) (the above photo alignment material has both a photo-aligned group (photodimerizaion group) and a thermal crosslinking group) | 100 parts by mass |
| Methyl ethyl ketone | 900 parts by mass |

Example 4

Preparation of Photo Alignment Film D

A composition for forming a photo alignment film D having the following composition was applied to the polarizer in the polarizing plate 01 using a bar coater and then baked in an oven at 100° C. for 2 minutes (thermosetting treatment) to form a coating film having a thickness of 100 nm.

The coating film was irradiated with polarized ultraviolet rays including an emission line of 313 nm at a dose of 10 mJ/cm$^2$ in a direction vertical to the surface of the coating film using a Hg—Xe lamp and a Glan-Taylor prism to carry out a photo alignment treatment. Thus, a photo alignment film D was prepared.

| Composition of Composition for Forming Photo Alignment Film D | |
|---|---|
| Polyorganosiloxane (PA-5) (see below) | 80 parts by mass |
| Poly(meth)acrylate (PB-5) (see below) | 20 parts by mass |
| Aluminum tris(acetylacetonate) (ALUMINUM CHELATE A(W), manufactured by Kawaken Fine Chemicals Co., Ltd.) | 10 parts by mass |
| Tri(p-trile) silanol | 40 parts by mass |
| n-Butyl acetate | 70 parts by mass |
| Cyclohexanone | 20 parts by mass |
| Ethyl acetoacetate | 5 parts by mass |
| Propylene glycol monomethyl ether acetate | 5 parts by mass |

(Synthesis of Polyorganosiloxane (POS-3))

Into a reactor provided with a stirrer, a thermo meter, a dripping funnel, and a reflux cooling tube, 70.5 g of 2-(3,4-epoxycyclohexyl)ethyltrimethoxysilane, 14.9 g of tetraethoxysilane, 85.4 g of ethanol, and 8.8 g of triethylamine were put and mixed at room temperature. Next, 70.5 g of deionized water was dripped with the dripping funnel for 30 minutes and then the materials were allowed to react at 80° C. for 2 hours under stirring under reflux. An operation of condensing the reaction solution and diluting the solution with butyl acetate was repeated twice and triethylamine and water were distilled. Thus, a polymer solution including polyorganosiloxane (POS-3) was obtained.

(Synthesis of Polyorganosiloxane (PA-5))

Into a three-necked flask having a volume of 100 mL, 9.3 g of polyorganosiloxane (POS-3), a cinnamic acid derivative (C-4), LIGHT ESTER HOMS (manufactured by Kyoeisha chemical Co., Ltd.), 26 g of methyl isobutyl ketone, and 0.93 g of tetrabutylammonium bromide were put and stirred at 80° C. for 12 hours. After the reaction was completed, the resultant was diluted with 100 g of butyl acetate and washed with water three times. An operation of condensing the reaction solution and diluting the solution with butyl acetate was repeated twice and finally a solution including polyorganosiloxane (PA-5) having a photo-aligned group was obtained.

The amounts of (C-4) and LIGHT ESTER HOMS were adjusted such that the introduced amounts thereof were respectively 40% by mol and 10% by mol with respect to the epoxy group in polyorganosiloxane (POS-3).

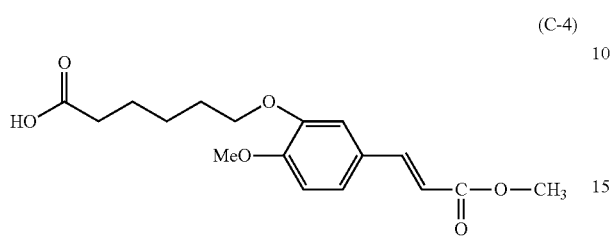

(C-4)

(Synthesis of Poly(Meth)Acrylate (PB-5))

100 parts by mass of poly(meth)acrylate (PB-2) below, 20 parts by mass of acryloyl group-containing carbonic acid (ARONIX M-5300, manufactured by Toagosei Co., Ltd.), 10 parts by mass of tetrabutylammonium bromide as a catalyst, and 150 parts by mass of propylene glycol monomethyl ether acetate as a solvent were put into a reactor and stirred under a nitrogen atmosphere at 90° C. for 12 hours. After the reaction was completed, the resultant was diluted with 100 parts by mass of propylene glycol monomethyl ether acetate and washed with water three times. An operation of condensing the reaction solution and diluting the solution with butyl acetate was repeated twice and finally a polymer solution including poly(meth)acrylate (PB-5) was obtained.

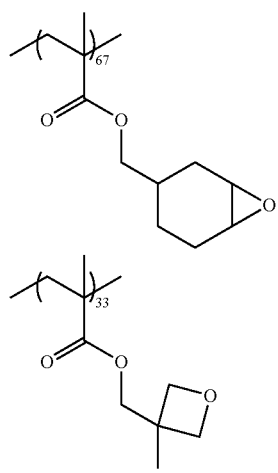

PB-2

Example 5

Preparation of Photo Alignment Film E

A composition for forming a photo alignment film E having the following composition was applied to the polarizer in the polarizing plate 01 using a bar coater and then heated at 60° C. for 1 minute (thermosetting treatment) to remove the solvent. Thus, a coating film was formed.

Next, the coating film was irradiated with linearly polarized ultraviolet rays having a wavelength near 313 nm with an ultra-high-pressure mercury lamp at a dose of 10 mJ/cm$^2$ in a direction at 900 with respect to the surface of the coating film to carry out a photo alignment treatment. Thus, a photo alignment film E having a thickness of 0.2 μm was prepared.

| Composition of Composition for Forming Photo Alignment Film E | |
|---|---|
| Photo-aligned polymer (i3-1) | 0.125 parts by mass |
| Polymer (ii1-1) | 0.04 parts by mass |
| p-toluene sulfonic acid hydrate | 0.005 parts by mass |
| 1-methoxy-2-propanol | 3 parts by mass |

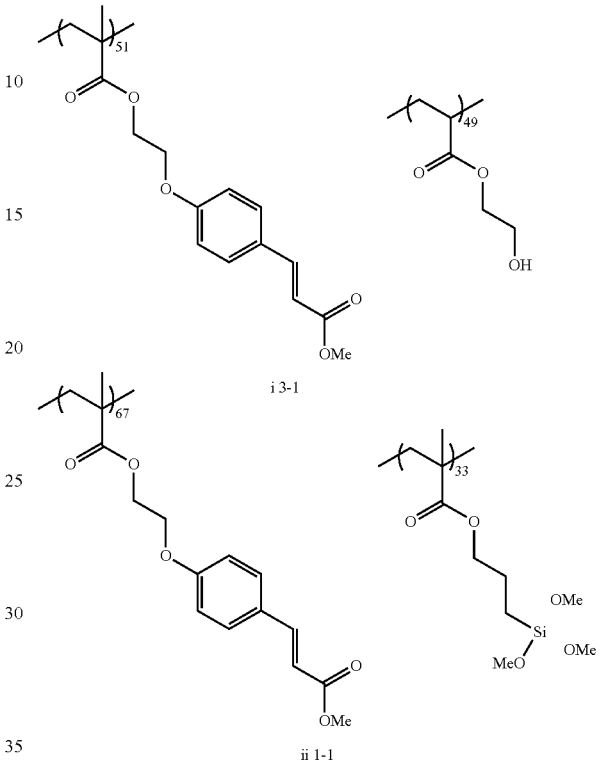

i 3-1 ii 1-1

Example 6

Preparation of Photo Alignment Film F

A composition for forming a photo alignment film E having the following composition was applied to the polarizer in the polarizing plate 01 using a spin coater and then dried at 100° C. for 3 minutes to form a coating film.

Next, the coating film was irradiated with linearly polarized light of visible ultraviolet rays (wavelength of 313 nm, irradiation intensity: 8 mW/cm$^2$) and parallel light through a wavelength cut filter, a band pass filter, and a polarizing filter from an ultra-high-pressure mercury lamp in a direction tilted at 45° with respect to the surface of the coating film to carry out a photo alignment treatment. Thus, a photo alignment film F was produced. The irradiation dose was 100 mJ/cm$^2$.

| Composition of Composition for Forming Photo Alignment Film F | |
|---|---|
| DiCin-10 | 1 part by mass |
| Adhesion improver 1 below | 2 parts by mass |
| Cyclopentanone | 97 parts by mass |

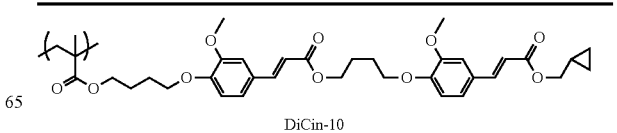

DiCin-10

-continued

Composition of Composition for Forming Photo Alignment Film F

Adhesion improver 1

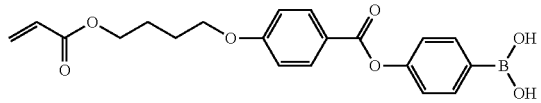

1 part by mass of the compound represented by the following formula was dissolved in 10 parts by mass of ethyl methyl ketone to obtain a solution 1. To the solution 1, 0.01 part by mass of azobisisobutyronitrile (AIBN) was added, and the mixture was heated and refluxed under a nitrogen atmosphere for 2 days to obtain a solution 2. Next, the solution 2 was added dropwise to 60 parts by mass of methanol and the materials were stirred to filter the precipitated solid. The obtained solid was dissolved in 5 parts by mass of tetrahydrofuran (THF), the resultant was added dropwise to 120 parts by mass of ice-cooled hexane, and the materials were stirred to filter the precipitated solid. The obtained solid was dissolved in THF, the resultant was added dropwise to 120 parts by mass of ice-cooled methanol, and the materials were stirred to filter the precipitated solid. The obtained solid was dissolved in THF and then the resultant was vacuum-dried to obtain DiCin-10.

izer in the polarizing plate 01 using a wire bar. The obtained coating film was dried with hot air at 100° C. for 120 seconds and irradiated with light in the air using an air cooling metal halide lamp (manufactured by EYEGRAPHICS CO., LTD.) with an output of 300 mW/cm$^2$.

Next, the surface of the obtained coating film was irradiated with ultraviolet light in the air using an air cooling metal halide lamp (manufactured by EYEGRAPHICS CO., LTD.) with an output of 160 mW/cm$^2$ in a direction vertical to the coating film to carry out a photo alignment treatment. Thus, a photo alignment film G was prepared. At this time, a wire grid polarizer (ProFlux PPL02, manufactured by Moxtek, Inc.) was set so as to be parallel with the surface of the coating film and set such that the transparent axis of the wire grid polarizer and absorption axis of the polarizer are parallel with each other, followed by exposure. Ultraviolet rays used herein was radiated at an illuminance of 100 mW/cm$^2$ in a UV-A region (integration of wavelength 380 nm to 320 nm) and an irradiation dose of 1,000 mJ/cm$^2$ in a UV-A region.

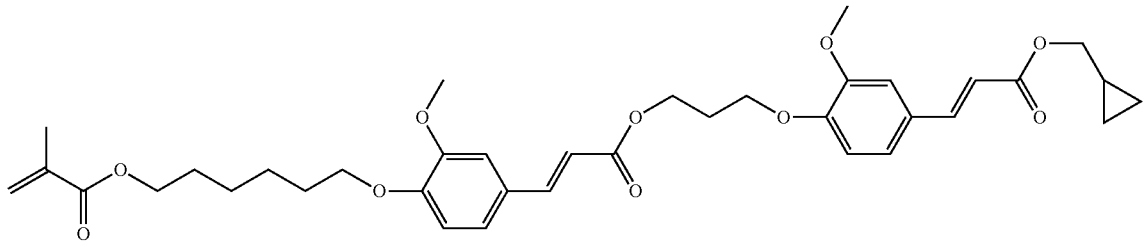 [SMILES: C=C(C)C(=O)OCCCCCCOc1ccc(/C=C/C(=O)OCCCOc2ccc(/C=C/C(=O)OCC3CC3)cc2OC)cc1OC]

Example 7

Preparation of Photo Alignment Film G

A composition for forming a photo alignment film G having the following composition was applied to the polar-

| Composition of Composition for Forming Photo Alignment Film G | |
|---|---|
| Material for photo alignment (c) below | 2 parts by mass |
| Chloroform | 98 parts by mass |

Material for photo alignment:

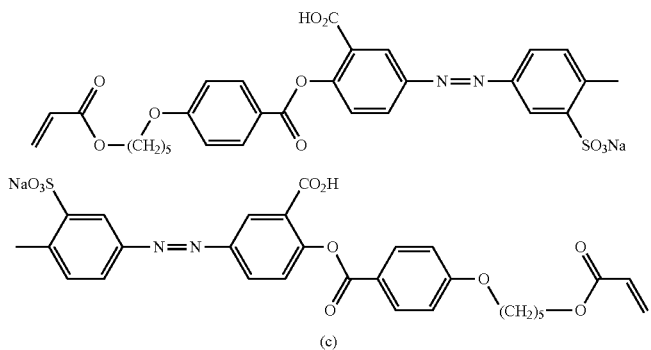

(c)

Comparative Example 2

Preparation of Alignment Film H

A composition for forming an alignment film H having the following composition was continuously applied to the polarizer in the polarizing plate 01 using a wire bar #8. The coating film was dried with hot air at 60° C. for 60 seconds and further dried with hot air at 100° C. for 120 seconds to form an alignment film H. Then, a rubbing treatment was carried out. Through the rubbing treatment, it was confirmed that the interface between the polarizer and the alignment film was partially peeled off.

The alignment film H did not include a photo-aligned group.

Composition for Forming Alignment Film H

| | |
|---|---|
| Modified polyvinyl alcohol below | 2.4 parts by mass |
| Isopropyl alcohol | 1.6 parts by mass |
| Methanol | 36 parts by mass |
| Water | 60 parts by mass |

Modified polyvinyl alcohol

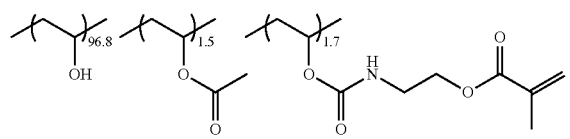

Comparative Example 3

Preparation of Photo Alignment Film 1

A composition for forming a photo alignment film 1 having the following composition was applied to the polarizer in the polarizing plate 01 using a wire bar. The coating film was dried with hot air at 100° C. for 120 seconds and irradiated with light in the air using an air cooling metal halide lamp (manufactured by EYEGRAPHICS CO., LTD.) with an output of 300 mW/cm².

Next, the surface of the obtained coating film was irradiated with ultraviolet rays in the air using an air cooling metal halide lamp (manufactured by EYEGRAPHICS CO., LTD.) with an output of 160 mW/cm² in a direction vertical to the coating film to carry out a photo alignment treatment and thus a photo alignment film 1 was prepared. At this time, a wire grid polarizer (ProFlux PPL02, manufactured by Moxtek, Inc.) was set so as to be parallel with the surface of the coating film and set such that the transparent axis of the wire grid polarizer and absorption axis of the polarizer are parallel with each other, followed by exposure. Ultraviolet rays used herein was radiated at an illuminance of 100 mW/cm² in a UV-A region (integration of wavelength 380 nm to 320 nm) and an irradiation dose of 1,000 mJ/cm² in a UV-A region.

The composition for forming a photo alignment film 1 did not include a compound having a crosslinking group.

Composition of Composition for Forming Photo Alignment Film 1

| | |
|---|---|
| Material for photo alignment below | 2 parts by mass |
| Chloroform | 98 parts by mass |

Material for photo alignment:

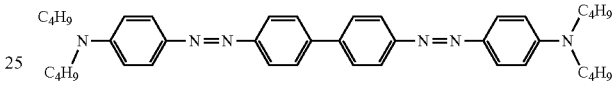

<Preparation of Optically Anisotropic Layer (Part 1)>

An optically anisotropic layer A or an optically anisotropic layer B was prepared on each of the alignment films prepared in above Examples and Comparative Examples according to the following procedure. The type of optically anisotropic layer arranged on each of the alignment films is collectively shown in Table which will be described later.

(Preparation of Optically Anisotropic Layer A)

The following composition A for forming an optically anisotropic layer was prepared. The composition was applied to the surface of slide glass and was observed with a polarizing microscope under heating. As a result, the smectic A phase-nematic phase transition temperature was 82° C.

Composition of Composition A for Optically Anisotropic Layer

| | |
|---|---|
| Smectic liquid crystal compound Sm-1 | 85 parts by mass |
| Rod-like compound RL-1 | 15 parts by mass |
| Photopolymerization initiator (IRGACURE 907, manufactured by Ciba Specialty Chemicals) | 3.0 parts by mass |
| Fluorine-containing compound A | 0.8 parts by mass |
| Methyl ethyl ketone | 588 parts by mass |

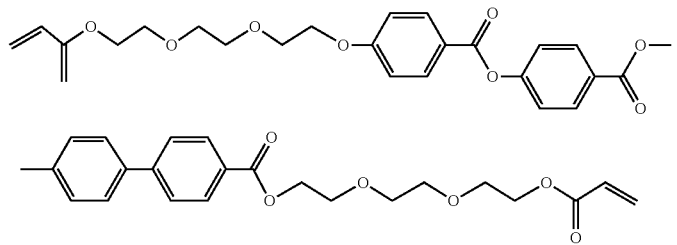

Smectic liquid crystal compound Sm-1

Composition of Composition A for Optically Anisotropic Layer

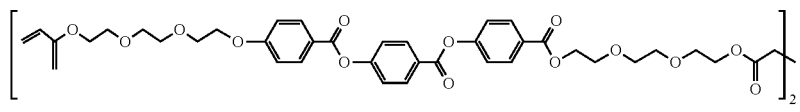

Rod-like compound RL-1

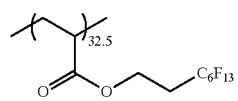

Fluorine-containing compound A

The composition A for an optically anisotropic layer was applied to the photo alignment film using a bar coater. Next, the coating film was thermally aged at a film surface temperature of 100° C. for 60 seconds and cooled to 70° C. Then, the film was irradiated with ultraviolet rays at a dose of 1,000 mJ/cm² in the air using an air cooling metal halide lamp (manufactured by EYEGRAPHICS CO., LTD.) with an output of 70 mW/cm² and the alignment state was fixed to form an optically anisotropic layer A. In the formed optically anisotropic layer A, the rod-like liquid crystal compound was aligned such that the slow axis direction was orthogonal to the polarized light irradiation direction. At this time, the thickness of the optically anisotropic layer was 0.8 μm. Using an automatic birefringence system (KOBRA 21ADH, manufactured by OJI SCIENCE INSTRUMENTS), the light incident angle dependency of Re and the tilt angle of the optical axis (that is, an inclination with respect to the plane of the optically anisotropic layer in a direction in which the refractive index of the optically anisotropic layer is the maximum) were measured. The results are collectively shown in Table which will be described below.

The polarized light irradiation direction refers to a direction of the vibration plane of the polarized light.

(Preparation of Optically Anisotropic Layer B)

The following composition B for an optically anisotropic layer was prepared. The composition was applied to the surface of a slide glass and was observed with a polarizing microscope under heating. As a result, a clear smectic A phase was imparted at 148° C. and was transferred into a nematic phase at 183° C. and the isotropic phase transition temperature was 255° C.

| Composition of Composition B for Optically Anisotropic Layer | |
|---|---|
| Smectic liquid crystal compound Sm-21 | 100 parts by mass |
| Photopolymerization initiator (IRGACURE 819, manufactured by Ciba Specialty Chemicals) | 3.0 parts by mass |
| Fluorine-containing compound A above | 0.8 parts by mass |
| Chloroform | 990 parts by mass |

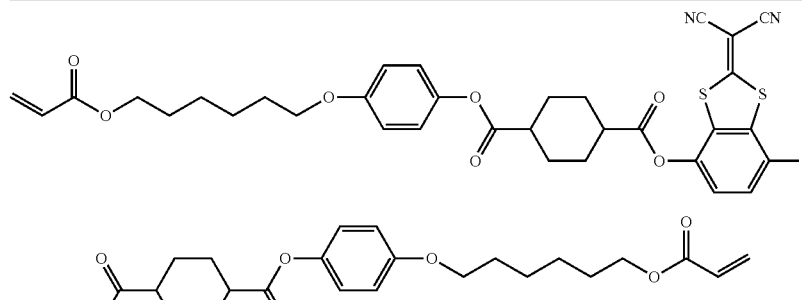

Smectic liquid crystal compound Sm-21; II-2-2

The composition B for an optically anisotropic layer was applied to the photo alignment film using a bar coater. The coating film was thermally aged at a film surface temperature of 150° C. for 60 seconds and then irradiated with ultraviolet rays at a dose of 1,000 mJ/cm² in the air the air using an air cooling metal halide lamp (manufactured by EYEGRAPHICS CO., LTD.) with an output of 70 mW/cm² to fix the alignment state. Thus, an optically anisotropic layer B was formed. In the formed optically anisotropic layer B, the rod-like liquid crystal compound Sm-21 was aligned such that the slow axis direction is orthogonal to the polarized light irradiation direction. At this time, the thickness of the optically anisotropic layer was 2 μm. Using an automatic birefringence system (KOBRA 21ADH, manufactured by OJI SCIENCE INSTRUMENTS), the light incident angle dependency of Re and the tilt angle of the optical axis were measured. The results are collectively shown in Table which will be described below.

<Preparation of Optically Anisotropic Layer (Part 2)>

An optically anisotropic layer C was further prepared on the above prepared optically anisotropic layer A or optically anisotropic layer B according to the following procedure. Using the laminate prepared in each of Examples and Comparative Examples, a polarizing plate including an optically anisotropic layer was prepared.

An alignment film was prepared on a temporary support for formation in the same procedure as in Comparative Example 2 except that the modified polyvinyl alcohol was changed to commercially available unmodified polyvinyl alcohol PVA 103 (manufactured by KURARAY Co., Ltd.).

The following composition K for an optically anisotropic layer was applied to the alignment film and thermally aged at 60° C. for 60 seconds and the coating film was irradiated with ultraviolet rays at a dose of 1,000 mJ/cm$^2$ in the air the air using an air cooling metal halide lamp (manufactured by EYEGRAPHICS CO., LTD.) with an output of 70 mW/cm$^2$ to fix the alignment state. The polymerizable rod-like liquid crystal compound was vertically aligned to prepare an optically anisotropic layer C (positive C plate). Rth was −115 nm at a wavelength of 550 nm.

| Composition of Composition K for Optically Anisotropic Layer | |
|---|---|
| Liquid crystal compound B01 | 80 parts by mass |
| Liquid crystal compound B02 | 20 parts by mass |
| Vertical aligning agent (S01) | 1 part by mass |
| Vertical aligning agent (S02) | 0.5 parts by mass |
| Ethylene oxide-modified trimethyol propane triacrylate V#360, manufactured by OSAKA ORGANIC CHEMICAL INDUSTRY LTD.) | 8 parts by mass |
| IRGACURE 907 (manufactured by BASF) | 3 parts by mass |
| KAYACURE DETX (manufactured by Nippon Kayaku Co., Ltd.) | 1 part by mass |
| B03 | 0.4 parts by mass |
| Methyl ethyl ketone | 170 parts by mass |
| Cyclohexanone | 30 parts by mass |

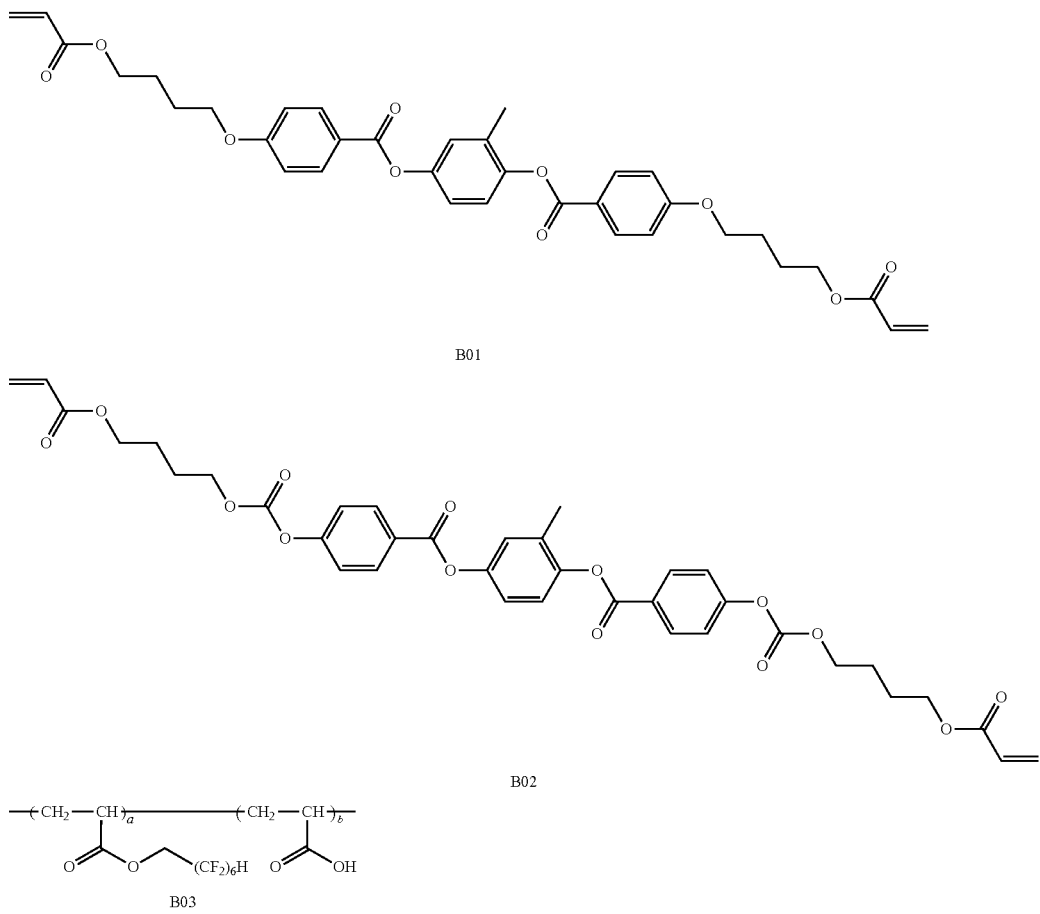

Composition of Composition K for Optically Anisotropic Layer

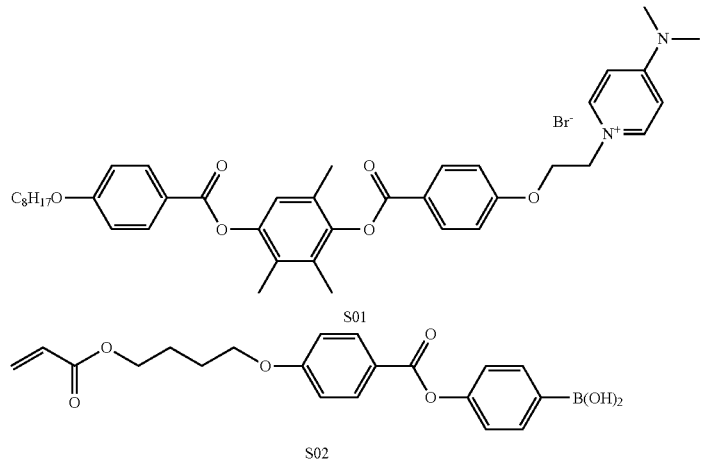

The optically anisotropic layer C (positive C plate) was laminated on the above prepared optically anisotropic layer A or optically anisotropic layer B using an adhesive. After the layer was laminated, the temporary support for formation was peeled off and thus a polarizing plate in which the optically anisotropic layer is arranged on the laminate of the present invention was prepared.

<Various Evaluations>
[Evaluation of Moisture-Heat Resistance]

In the present invention, the orthogonal transmittance CT of the polarizing plate (the polarizing plate in which the optically anisotropic layer was arranged on the laminate) was measured at a wavelength of 410 nm using an automated polarizing film measurement device VAP-7070 manufactured by JASCO Corporation in the following manner.

Two samples in which the polarizing plate of the present invention was attached to glass with an adhesive (5 cm×5 cm) were prepared. At this time, the polarizing plate was attached to the glass such that the side serving as a polarizing plate protective film is attached to the side opposite to the glass (air interface side). The orthogonal transmittance was measured by setting the glass side of the sample toward the light source. The two samples were respectively measured and the average value was set as the orthogonal transmittance CT.

Thereafter, various polarizing plates were stored over time under the temporal conditions which will be described later and then the orthogonal transmittance CT of each polarizing plate was measured in the same manner. Changes in the orthogonal transmittance CT before and after time had passed were obtained and these changes were evaluated as polarizing plate durability based on the following criteria. Grade "A" or "B" is desirable for practical use.

The relative humidity under an environment without humidity adjustment was within a range of 0 to 20% RH.
—Temporal Conditions—
Under an environment at 60° C. and a relative humidity of 95% RH for 500 hours
Evaluation Criteria:
A: A change in the orthogonal transmittance CT before and after time has passed is less than 0.6%.
B: A change in the orthogonal transmittance CT before and after time has passed is 0.6 to 1.0%.

C: A change in the orthogonal transmittance CT before and after time has passed is more than 1.0%.

[Adhesiveness]

The photo alignment film of each laminate obtained in Examples and Comparative Examples was cut with a cutter knife at an interval of 1 mm using an equivalent interval spacer with a guide to form a 10×10 lattice pattern. Subsequently, a cellophane tape was put on the lattice pattern and was caused to firmly adhere to the lattice and then the cellophane tape was peeled off. After the cellophane tape was peeled off, the cut portion of the photo alignment film was observed. Regarding the number of meshes of the lattice in which peeling occurred along the cut line of the photo alignment film or at the intersection point with respect to the total number of lattice patterns, the adhesiveness in the case in which peeling was not confirmed was determined to be excellent ("A"), the adhesiveness in the case in which the number of meshes of the lattice in which peeling occurred with respect to the total number of lattice patterns was less than 15% was determined to be good ("B"), and the adhesiveness in the case in which the number of meshes of the lattice in which peeling occurred with respect to the total number of lattice patterns was 15% or more was determined to be poor ("C").

[Evaluation of Solvent Resistance]

The compositions for forming a photo alignment film or the composition for forming an alignment film used in each of Examples and Comparative Examples were respectively applied to silicon wafers using a spin coater and then a predetermined curing treatment was carried out. Thus, a cured film having a thickness of 0.2 μm was formed. For the curing treatment, in the case in which the crosslinking group in the compound included in the composition is a thermal crosslinking group, the coating film was baked on a hot plate at a thermosetting temperature of 130° C. for 60 seconds, and in the case in which the crosslinking group is a photo-crosslinking group, the coating film was irradiated with light in the air using an air cooling metal halide lamp (manufactured by EYEGRAPHICS CO., LTD.) with an output of 300 mW/cm$^2$.

The thickness of the film was measured using F20 manufactured by FILMETRICS. The cured film was immersed in cyclohexanone (CHN) for 60 seconds and then dried at a temperature of 100° C. for 60 seconds to measure the thickness of the film. A cured film that caused no change in the film thickness after the immersion in CHN was evaluated as "A" and a cured film in which a decrease of the thickness of the film after the immersion was observed was evaluated as "B".

[Film Hardness]

Photo alignment films were prepared in the same operations as in each of Examples and Comparative Examples except that a glass substrate was used instead of the polarizing plate 01. Regarding the photo alignment film, a pencil scratching tester for coating film was used to measure the film hardness. A case in which the pencil hardness measurement result was 3H or higher was determined to be excellent ("A"), a case in which the pencil hardness measurement result was lower than 3H and H or higher was determined to be good ("B"), and a case in which the pencil hardness measurement result was lower than H was determined to be poor ("C").

<Preparation of Liquid Crystal Display Device>

The polarizing plate on the visible side was peeled off from the liquid crystal cell of an iPad (in which a photo alignment film was used; manufactured by Apple Inc.) was used as an IPS mode liquid crystal cell in which a photo alignment film was used. The pre-tilt angle in the liquid crystal cell was 0°.

The polarizing plate in which the optically anisotropic layer was arranged on each laminate prepared in Examples and Comparative Examples above was laminated on the liquid crystal cell instead of the peeled polarizing plate and thus a liquid crystal display device was prepared. At this time, the lamination was carried out such that the absorption axis of the polarizer and the optical axis of the liquid crystal layer in the liquid crystal cell are orthogonal to each other when observing in a direction vertical to the surface of the liquid crystal cell substrate. In addition, the optically anisotropic layer in the polarizing plate was arranged to be disposed on the side opposite to the backlight.

Comparative Example 1 corresponds to an embodiment in which a liquid crystal display device was prepared using the polarizing plate 01 as a polarizing plate.

The display performance was measured with a commercially available device for measuring a liquid crystal viewing angle and chromaticity characteristics Ezcom (manufactured by ELDIM S.A.) and a backlight of a commercially available liquid crystal display device iPad (manufactured by Apple, Inc.) was used. The measurements were carried out by arranging the liquid crystal cell on which a polarizing plate was laminated such that the optically anisotropic layer is arranged on the side opposite to the backlight. The results are collectively shown in Table.

[Panel Contrast (Panel CR)]

Using the liquid crystal display device, the luminance (Yw) of the white display mode in a direction vertical to the panel and the luminance (Yb) of the black display mode in a direction vertical to the panel were measured and the contrast ratio (Yw/Yb) in a direction vertical to the panel was calculated. The obtained value was set as a front contrast and evaluated based on the following criteria.

A: The front contrast is 95% or higher with respect to Comparative Example 1.

B: The front contrast is 85% or higher and lower than 95% with respect to Comparative Example 1.

C: The front contrast is 75% or higher and lower than 85% with respect to Comparative Example 1.

D: The front contrast is lower than 75% with respect to Comparative Example 1.

[Light Leakage in Tilted Direction (Oblique Light Leakage)]

The respective maximum values of black luminance (Cd/m$^2$) in the upper directions (at an azimuthal angle of 00 to 180° and an interval of 5°) and the lower directions (at an azimuthal angle of 180° to 360° and an interval of 5°) were averaged to calculate an average value (luminance max).

As the numerical value decreases, the light leakage in the black display mode decreases. The evaluation was carried out in 4 stages of A to D below.

A: 1 or less
B: more than 1 and 2 or less
C: more than 2 and 5 or less
D: More than 5

In Table 1, the column of "Type" of the column of "Optically anisotropic layer" indicates that either the optically anisotropic layer A or the optically anisotropic layer B was used.

In Examples and Comparative Examples, the in-plane slow axis of the optically anisotropic layer A or B and the absorption axis of the polarizer were orthogonal to each other.

TABLE 1

| | Type of photo alignment film | Optically anisotropic layer | | | | | |
|---|---|---|---|---|---|---|---|
| | | Optically anisotropic layer A or B | | | | Optically anisotropic layer C | |
| | | Type | Average tilt angle | Re(550) (nm) | Re(450)/ Re(550) | Re(650)/ Re(550) | Average tilt angle | Rth(550) (nm) |
| Example 1 | A | A | 0° | 130 | 0.81 | 1.05 | 90° | −115 |
| Example 2 | B | A | 2° | 138 | 0.82 | 1.02 | 90° | −115 |
| Example 3 | C | B | 3° | 130 | 0.8 | 1.02 | 90° | −115 |
| Example 4 | D | B | 4° | 130 | 0.82 | 1.02 | 90° | −115 |
| Example 5 | E | A | 4° | 132 | 0.82 | 1.03 | 90° | −115 |
| Example 6 | F | A | 5° | 130 | 0.84 | 1.02 | 90° | −115 |
| Example 7 | G | B | 2° | 135 | 0.81 | 1.06 | 90° | −115 |
| Comparative Example 1 | — | — | — | — | — | — | — | — |
| Comparative Example 2 | H | A | 0° | 130 | 0.84 | 1.03 | 90° | −115 |
| Comparative Example 3 | I | B | 0° | 132 | 0.84 | 1.03 | 90° | −115 |

TABLE 1-continued

|  | Evaluation | | | | | |
| --- | --- | --- | --- | --- | --- | --- |
|  | Moisture-heat resistance | Adhesiveness | Solvent resistance | Film hardness | Panel CR | Oblique light leakage |
| Example 1 | B | A | A | B | A | B |
| Example 2 | A | A | A | A | A | B |
| Example 3 | A | A | A | A | A | A |
| Example 4 | A | A | A | A | A | A |
| Example 5 | A | A | A | A | A | B |
| Example 6 | B | A | A | A | A | B |
| Example 7 | A | A | A | B | A | A |
| Comparative Example 1 | — | — | — | — | — | D |
| Comparative Example 2 | C | C | A | C | C | B |
| Comparative Example 3 | C | C | B | B | A | B |

As seen from Table 1 above, it was confirmed that the laminate of the present invention was excellent in moisture-heat resistance. In addition, the laminate was also excellent in various effects (for example, adhesiveness, solvent resistance, film hardness, panel CR, and oblique light leakage) in addition to the moisture-heat resistance.

On the other hand, in the laminates in Comparative Examples 2 and 3 in which predetermined requirements are not satisfied, the desired effect was not obtained.

What is claimed is:

1. A laminate comprising:
    a polarizer; and
    a photo alignment film that is adjacently arranged on the polarizer,
    wherein the photo alignment film is formed by first bringing a composition for forming the photo alignment film into direct contact with a surface of the polarizer, to form a coating film on the surface of the polarizer,
    wherein the composition for forming the photo alignment film contains Compound A having a photo-aligned group and Compound B having a crosslinking group, or Compound C having a photo-aligned group and a crosslinking group,
    wherein the Compound B or the Compound C is bonded to the polarizer via the crosslinking group,
    wherein the crosslinking group is a (meth)acryloyl group or a boronic acid group,
    wherein the coating film is cured via a reaction between crosslinking groups in the composition, and a reaction of the polarizer and the crosslinking group of the Compound B or the Compound C, and
    wherein the coating film is photo-aligned by subjecting the photo-aligned group of the Compound A or the Compound C to a photo alignment treatment.

2. The laminate according to claim 1,
    wherein the photo-aligned group is a group having a structure in which photodimerization or photoisomerization is caused.

3. The laminate according to claim 1,
    wherein the photo-aligned group is a group selected from the group consisting of a group having an azobenzene structure and a group having a cinnamoyl structure.

4. The laminate according to claim 1, further comprising:
    an optically anisotropic layer including a liquid crystal compound on a surface of the photo alignment film on the side opposite to the polarizer.

5. The laminate according to claim 1,
    wherein the composition for forming the photo alignment film contains the Compound A having the photo-aligned group and the Compound B having the crosslinking group.

6. A method of producing the laminate according to claim 1 comprising at least:
    a step of forming the coating film on the polarizer by bringing the composition for forming the photo alignment film containing the Compound A having the photo-aligned group and the Compound B having the crosslinking group, or the Compound C having the photo-aligned group and the crosslinking group, into direct contact with the surface of the polarizer; and
    a step of forming the photo alignment film by subjecting the coating film to a curing treatment and the photo alignment treatment in random order.

7. A polarizing plate comprising the laminate according to claim 1.

8. A liquid crystal display device comprising the laminate according to claim 1.

9. The liquid crystal display device according to claim 8 which is of an IPS mode.

10. An organic EL display device comprising the laminate according to claim 1.

11. The laminate according to claim 2,
    wherein the photo-aligned group is a group selected from the group consisting of a group having an azobenzene structure and a group having a cinnamoyl structure.

12. The laminate according to claim 2, further comprising:
    an optically anisotropic layer including a liquid crystal compound on a surface of the photo alignment film on the side opposite to the polarizer.

* * * * *